(12) United States Patent
Kouda et al.

(10) Patent No.: US 11,231,464 B2
(45) Date of Patent: Jan. 25, 2022

(54) MONITORING APPARATUS

(71) Applicant: DENSO CORPORATION, Kariya (JP)

(72) Inventors: Masakazu Kouda, Kariya (JP);
Shinsuke Kawamoto, Kariya (JP);
Hayato Mizoguchi, Kariya (JP); Ryo Yamakawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 236 days.

(21) Appl. No.: 16/439,998

(22) Filed: Jun. 13, 2019

(65) Prior Publication Data

US 2019/0391209 A1 Dec. 26, 2019

(30) Foreign Application Priority Data

Jun. 20, 2018 (JP) .............................. JP2018-116745
Jul. 13, 2018 (JP) .............................. JP2018-133403

(51) Int. Cl.

| H02J 7/00 | (2006.01) |
|---|---|
| G01R 31/364 | (2019.01) |
| G01R 31/3828 | (2019.01) |
| G01R 31/396 | (2019.01) |
| G01R 31/388 | (2019.01) |
| G01R 19/165 | (2006.01) |
| B60L 58/12 | (2019.01) |

(52) U.S. Cl.
CPC ..... *G01R 31/364* (2019.01); *G01R 19/16542* (2013.01); *G01R 31/388* (2019.01); *G01R 31/3828* (2019.01); *G01R 31/396* (2019.01); *B60L 58/12* (2019.02); *B60L 2240/547* (2013.01); *Y02T 10/70* (2013.01)

(58) Field of Classification Search
CPC .............. G01R 31/364; G01R 31/3828; G01R 31/396; G01R 31/388; G01R 19/16542; B60L 58/12; B60L 2240/547; B60L 50/64; B60L 3/12; Y02T 10/70
USPC ......................................... 320/116–119, 132
See application file for complete search history.

(56) References Cited

U.S. PATENT DOCUMENTS

2010/0271036 A1\* 10/2010 Kishimoto .......... H01M 50/572
324/434
2015/0044531 A1 2/2015 Itagaki et al.
(Continued)

FOREIGN PATENT DOCUMENTS

JP 2015-118731 A 6/2015

*Primary Examiner* — Zixuan Zhou
(74) *Attorney, Agent, or Firm* — Oliff PLC

(57) ABSTRACT

A monitoring apparatus includes: a monitoring portion that monitors a voltage of each of battery cells connected in series, each of the battery cells having an electrode terminal; and a wiring portion that connects the monitoring portion and the electrode terminal. The wiring portion includes a first flexible substrate and a second substrate that have flexibility and are integrally linked with each other. A linking part where the first flexible substrate and the second flexible substrate are linked is bent. The first flexible substrate is connected with the electrode terminal. The second flexible substrate is connected with the monitoring portion. One of the first flexible substrate and the second flexible substrate includes an arm. Another of the first flexible substrate and the second flexible substrate other than the one including the arm includes a slit. The arm is fixed to the slit, causing the linking part to be reinforced.

5 Claims, 27 Drawing Sheets

(56) References Cited

U.S. PATENT DOCUMENTS

2018/0219204 A1    8/2018  Takase et al.
2018/0248167 A1*   8/2018  Hashizawa ......... H01M 50/543

* cited by examiner

FIG. 2

MONITORING APPARATUS

CROSS REFERENCE TO RELATED APPLICATIONS

The present application claims the benefit of priority from Japanese Patent Application No. 2018-116745 filed on Jun. 20, 2018 and Japanese Patent Application No. 2018-133403 filed on Jul. 13, 2018. The entire disclosures of the above applications are incorporated herein by reference.

TECHNICAL FIELD

The present disclosure relates to a battery cell monitoring apparatus.

BACKGROUND

A wiring material connects multiple battery cells with a control substrate.

A battery wiring module detects voltages of multiple unit batteries. The battery wiring module includes a bus bar connecting electrodes of different unit batteries with each other, and a flexible substrate including a voltage detection line connected with the bus bar.

SUMMARY

The present disclosure provides a monitoring apparatus that may include: a monitoring portion that may monitor a voltage of each of multiple battery cells connected in series, each of the battery cells having an electrode terminal; and a wiring portion that may electrically connect the monitoring portion and the electrode terminal of the battery cell.

Further, the present disclosure provides a monitoring apparatus that may include: multiple series terminals that may connect a positive electrode terminal of a first cell and a negative electrode terminal of a second cell, the first cell and the second cell being included in at least three battery cells that are aligned in a first direction and being placed adjacent to each other; a wiring portion that may include a wiring pattern connected with the series terminals; and a monitoring portion that may monitor a voltage of each of the battery cells input through the wiring pattern.

BRIEF DESCRIPTION OF THE DRAWINGS

The above and other objects, features and advantages of the present disclosure will become more apparent from the following detailed description made with reference to the accompanying drawings. In the drawings:

FIG. 2 is a top view illustrating a battery stack.

DETAILED DESCRIPTION

Figure 1:
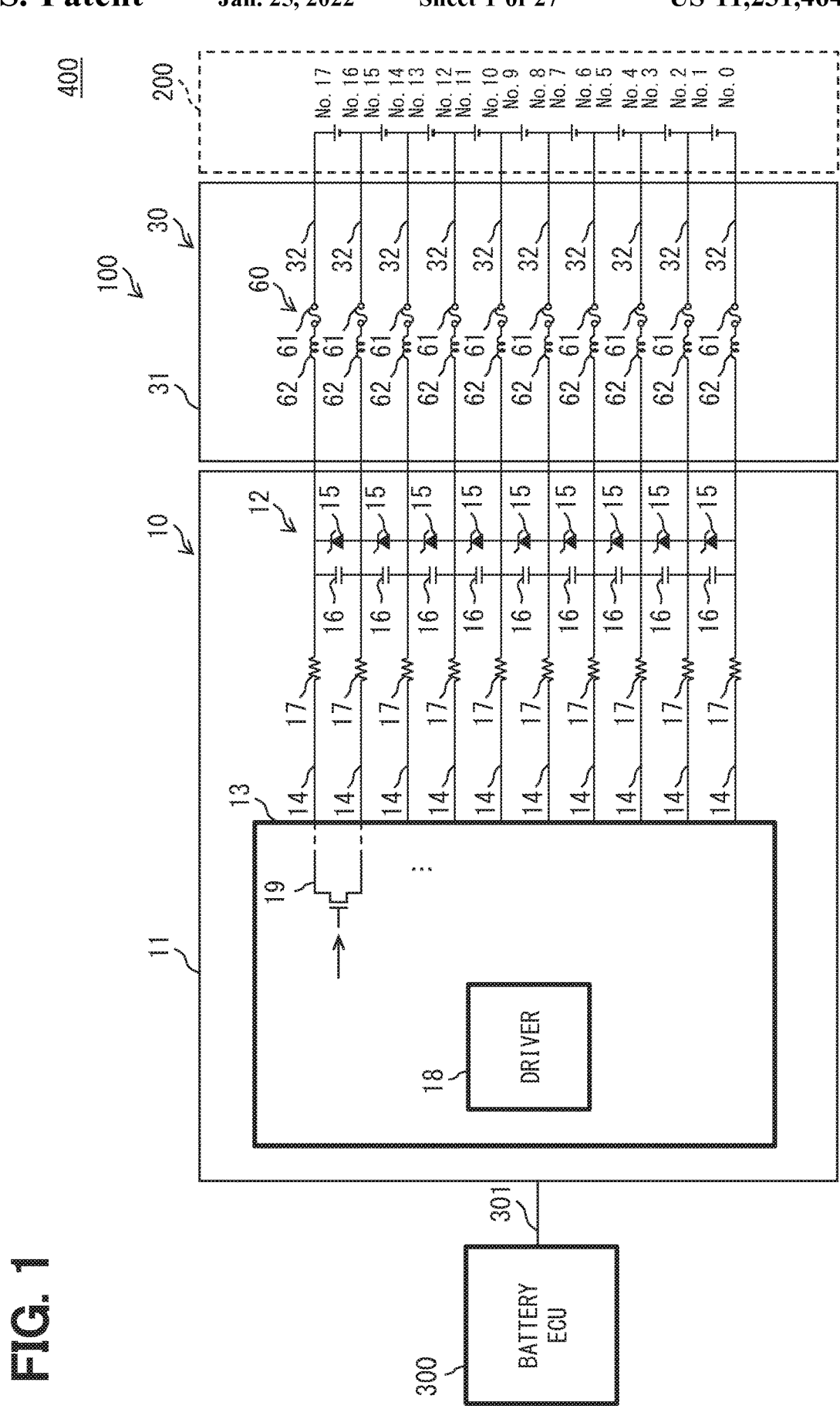
FIG. 1 is a circuit diagram of a battery pack.

A wiring material is connected with electrodes of multiple battery cells. Therefore, the wiring material is placed on surfaces of the multiple battery cells. The electrodes of the multiple battery cells are formed on the surfaces (also referred to as formation surfaces).

The wiring material is connected not only with the electrode of the battery cell, but also with the control substrate. The control substrate is placed on a surface of the battery cell different from the formation surface when the formation surface includes no space where the control substrate is arranged.

A part of the wiring material is also placed on the surface different from the formation surface. As the result, the wiring material is placed on each of the formation surface and the surface different from the formation surface. For implementing the configuration, for example, a part of the wiring material is bent. Further, it may be possible to also consider a configuration where the wiring material and the control substrate are overlapped on the control substrate. For implementing the configuration also, a part of the wiring material is bent.

A stress concentration occurs in the bent part in such a mode that the wiring material is bent. Thereby, a lifetime of the wiring material may deteriorate.

Hereinafter, embodiments will be described with reference to the drawings.

First Embodiment

FIGS. 1 to 7 describe a battery pack monitoring apparatus according to the embodiment. In the embodiment, an example that a battery pack is applied to a hybrid vehicle is described.

(Overview of Battery Pack)

A battery pack 400 functions as power supply to an electrical load of the hybrid vehicle. The electrical load includes a motor generator that implements a function as a power supply source and an electricity generation source. For example, when the motor generator performs power running, the battery pack 400 discharges to supply electric power to the motor generator. When the motor generator generates electricity, the battery pack 400 charges generated electric power caused by the electricity generation.

The battery pack 400 includes a battery ECU 300. The battery ECU 300 is electrically connected with each kind of ECUs (also referred to as in-vehicle ECUs) mounted on the hybrid vehicle. The battery ECU 300 and the in-vehicle ECU mutually transmit or receive signals to perform a cooperation control to the hybrid vehicle. Due to the cooperation control, the electricity generation and the power running of the motor generator in accordance with a charge amount of the battery pack 400, and an output of an internal combustion engine, or the like are controlled.

An ECU is an abbreviation of electronic control unit. The ECU includes at least one calculation process unit (also referred to as a CPU) and at least one memory device (also referred to as a MMR) as a storage medium storing a program and data. The ECU includes a microcontroller including a computer readable storage medium. The storage medium corresponds to a non-transitory tangible storage medium that non-temporally stores a readable program by the computer. The storage medium may include a semiconductor memory, a magnetic disk, or the like.

The battery pack 400 includes a battery module 200. The battery module 200 shown in FIG. 2 includes a battery stack 210 in which multiple battery cells 220 are electrically and mechanically connected in series.

The battery pack 400 includes a monitoring apparatus 100. The monitoring apparatus 100 detects a voltage of each battery cell 220 that configures the battery stack 210. The monitoring apparatus 100 outputs a monitoring result to the battery ECU 300. The battery ECU 300 determines equalization for SOCs of each of the multiple battery cells 220, based on the monitoring result of the monitoring apparatus 100. The battery ECU 300 outputs an instruction of an equalization process based on the determination to the monitoring apparatus 100. The monitoring apparatus 100 executes the equalization process that equalizes the SOCs of the multiple battery cells 220 in accordance with the instruction input from the battery ECU 300. The SOC is an abbreviation of state of charge.

The battery pack 400 includes the monitoring apparatus 100, the battery module 200, and the battery ECU 300. In addition to the monitoring apparatus 100, the battery module 200, and the battery ECU 300, the battery pack 400 includes a blowing fan (not shown) cooling the battery module 200. The battery ECU 300 controls actuation of the blowing fan.

The battery pack 400 is placed in, for example, an arrangement space under a seat of the hybrid vehicle. The arrangement space under a rear seat may be larger than the arrangement space under a front seat. Therefore, the battery pack 400 in the embodiment may be placed in the arrangement space under the rear seat. However, a placement position of the battery pack 400 is not limited to the arrangement space under the rear seat. The battery pack 400 can be placed, for example, between the rear seat and a luggage space, between a driver seat or a front passenger seat, or the like. Hereinafter, the battery module 200 and the monitoring apparatus 100 will be described.

(Overview of Battery Module)

Three directions orthogonal to each other may be referred to as a lateral direction, a longitudinal direction, and a height direction. In the embodiment, the lateral direction is along an advancing/retreating direction of the hybrid vehicle. The longitudinal direction is along a right/left direction of the hybrid vehicle. The height direction is along a vertical direction of the hybrid vehicle. Incidentally, three directions orthogonal to each other may be referred to as a first direction, a second direction, a third direction.

The battery module 200 includes the battery stack 210. The battery module 200 includes a battery case (not shown) that accommodates the battery stack 210. The battery case includes a housing and a lid. The housing is produced by aluminum die casting. The housing can be also produced by press working of iron or stainless steel. The lid is formed by a resin material or a metal material.

The housing has a box shape which opens in the height direction and includes a bottom. The opening of the housing is covered with lid. The housing and the lid form an accommodation space that accommodates the battery stack 210. The accommodation space includes a flowing path where winds flow. At least one of the housing or the lid includes a communication hole communicating an outside atmosphere with the flowing path.

The battery stack 210 includes multiple battery cells 220. These multiple battery cells 220 are aligned (also referred to as placed) in the longitudinal direction. The multiple battery cells 220 are electrically and mechanically connected in series. Therefore, an output voltage of the battery module 200 is obtained by summing the output voltages of the multiple battery cells 220.

(Overview of Monitoring Apparatus)

As shown in FIG. 1, the monitoring apparatus 100 includes a monitoring portion 10 that monitors the voltage of the multiple battery cells 220, and a wiring portion 30 that electrically connects the monitoring portion 10 with each of the multiple battery cells 220.

The monitoring portion 10 is placed with the battery module 200 in such a mode that the monitoring portion 10 is aligned with the battery stack 210 in the longitudinal direction or the height direction. The wiring portion 30 is placed with the battery module 200 in a mode where the monitoring portion 10 is aligned with the battery stack 210 in the height direction.

(Configuration of Battery Stack)

Figure 2:
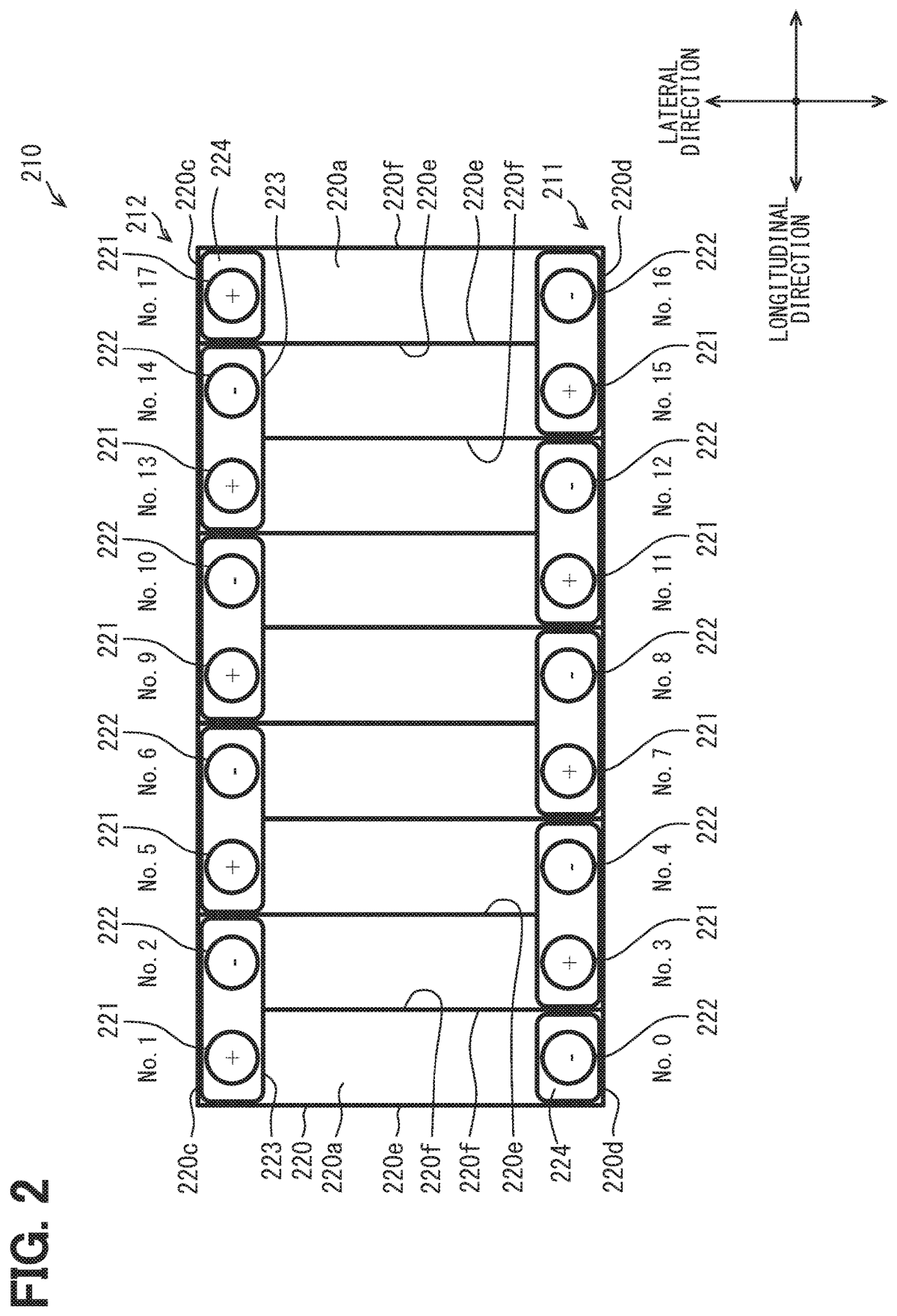

The battery stack 210 includes multiple battery cells 220. As shown in FIG. 2, the battery cell 220 has a quadrangular prism shape. The battery cell 220 has six surfaces.

The battery cell 220 includes an upper end surface 220a and a lower end surface 220b facing in the height direction. The battery cell 220 includes a first side surface 220c and a second side surface 220d facing in the lateral direction. The battery cell 220 includes a first main surface 220e and a second main surface 220f facing in the longitudinal direction. Among these six surfaces, the first main surface 220e and the second main surface 220f have larger areas than the other four surfaces.

In the battery cell 220, a length in the longitudinal direction is shorter than a length in the height direction and a length in the lateral direction. Therefore, the battery cell 220 has a flat shape with a short longitudinal length. The multiple battery cells 220 are aligned in the longitudinal direction.

The battery cell 220 corresponds to a secondary battery. Specifically, the battery cell 220 corresponds to a lithium ion secondary battery. The lithium ion secondary battery generates an electromotive voltage by a chemical reaction. A generation of the electromotive voltage causes a current to flow in the battery cell 220. Thereby, a gas occurs in the battery cell 220. The battery cell 220 may expand. The battery cell 220 is not limited to the lithium ion secondary battery. As the battery cell 220, for example, a nickel hydrogen secondary battery, an organic radical battery, or the like can be employed.

The first main surface 220e and the second main surface 220f of the battery cell 220 have larger areas than the other four surfaces. Therefore, in the battery cell 220, the first main surface 220e and the second main surface 220f may easily expand. Thereby, the battery cell 220 may expand in the longitudinal direction. That is, the battery cell 220 may expand in a direction aligned with the multiple battery cells 220.

The battery stack 210 includes a restraint (not shown). The restraint mechanically connects, in series, the multiple battery cells 220 in the longitudinal direction. The restraint prevents an increase in a size of the battery stack 210, the increase being caused by the each expansion of the multiple battery cells 220. A gap is provided between the battery cells 220 adjacent to each other. Air passes through the gap, and heat dissipation of each battery cell 220 is promoted. The longitudinal direction may correspond to a predetermined direction.

A positive electrode terminal 221 and a negative electrode terminal 222 are formed on the upper end surface 220a of the battery cell 220. The positive electrode terminal 221 and the negative electrode terminal 222 are aligned apart from each other in the lateral direction. The positive electrode terminal 221 is positioned toward the first side surface 220c. The negative electrode terminal 222 is positioned toward the second side surface 220d. The upper end surface 220a corresponds to a formation surface.

As shown in FIG. 2, between the two battery cells 220 aligned adjacent to each other, each of first main surfaces 220e faces each other, and each of the second main surfaces 220f faces each other. Thereby, the upper end surfaces 220a of the two battery cells 220 aligned adjacent to each other are aligned in the longitudinal direction. In the two battery cells 220 aligned adjacent to each other, the positive electrode terminal 221 of one battery cell 220 and the negative electrode terminal 222 of the other battery cell 220 are aligned in the longitudinal direction. As the result, in the battery stack 210, the positive electrode terminal 221 and the negative electrode terminal 222 are alternately aligned in the longitudinal direction.

The battery stack 210 includes a first electrode terminal group 211 where the negative electrode terminal 222 and the positive electrode terminal 221 are alternately aligned in the longitudinal direction, and a second electrode terminal group 212 where the positive electrode terminal 221 and the negative electrode terminal 222 are alternately aligned in the longitudinal direction. The positive electrode terminal 221 and the negative electrode terminal 222 in the first electrode terminal group 211 are aligned in a reversed order of the second electrode terminal group 212. The first electrode terminal group 211 and the second electrode terminal group 212 are aligned apart from each other in the lateral direction.

Among the electrode terminals configuring the first electrode terminal group 211 and the second electrode terminal group 212, one positive electrode terminal 221 and one negative electrode terminal 222 adjacent to each other in the longitudinal direction are mechanically and electrically connected by a series terminal 223 extending in the longitudinal direction. Thereby, the multiple battery cells 220 configuring the battery stack 210 are electrically connected in series.

The battery stack 210 in the embodiment includes nine battery cells 220. Therefore, a total number of the positive electrode terminal 221 and the negative electrode terminal 222 is eighteen. As shown in FIG. 1 to FIG. 4, number symbols (No. n, n being 0 to 17) increasing in number from the lowest potential to the highest potential are applied to these eighteen electrode terminals.

As shown in FIG. 2, the positive electrode terminal 221 of No. 1 and the negative electrode terminal 222 of No. 2 are aligned adjacent to each other in the longitudinal direction. The positive electrode terminal 221 and the negative electrode terminal 222 aligned adjacent to each other in the longitudinal direction are connected by the series terminal 223.

Similarly, in the first electrode terminal group 211, the electrode terminals of No. 1 and No. 2, the electrode terminals of No. 5 and No. 6, the electrode terminals No. 9 and No. 10, and the electrode terminals No. 13 and No. 14 are connected by the series terminals 223. In the second electrode terminal group 212, the electrode terminals of No. 3 and No. 4, the electrode terminals of No. 7 and No. 8, the electrode terminals No. 11 and No. 12, and the electrode terminals No. 15 and No. 16 are connected by the series terminals 223. The nine battery cells 220 are connected in series by the total of eight series terminals 223.

In the connection configuration, the negative electrode terminal 222 of No. 0 has the lowest potential. The negative electrode terminal 222 of No. 0 has the ground potential. The positive electrode terminal 221 of No. 17 has the highest potential. The positive electrode terminal 221 of No. 17 has a potential obtained by summing outputs of each of the battery cells 220.

The negative electrode terminal 222 having the lowest potential and the positive electrode terminal 221 having the highest potential are connected with output terminals 224. These two output terminals 224 are electrically connected with an electrical load. As the result, a potential difference between the lowest potential and the highest potential is output to the electrical load as the output voltage of the battery module 200.

(Circuit Configuration of Monitoring Apparatus)

A circuit configuration of the monitoring apparatus 100 will be described with reference to FIG. 1.

As shown in FIG. 1, the monitoring portion 10 includes a wiring substrate 11, a first electronic element 12, and a monitoring IC chip 13. The first electronic element 12 and the monitoring IC chip 13 are mounted on the wiring substrate 11. The first electronic element 12 and the monitoring IC chip 13 are electrically connected by a substrate wiring 14 of the wiring substrate 11.

The wiring portion 30 is connected with the wiring substrate 11. The wiring portion 30 is connected with the battery stack 210. Thereby, the monitoring portion 10 is electrically connected with the battery stack 210 by the wiring portion 30.

A connector (not shown) is placed on the wiring substrate 11. A wire 301 shown in FIG. 1 is connected with the connector. The monitoring portion 10 and the battery ECU 300 are electrically connected by the wire 301.

The wiring portion 30 includes a flexible substrate 31 having flexibility and multiple wiring patterns 32 formed on the flexible substrate 31.

The multiple wiring patterns 32 are connected with the series terminal 223 and the output terminal 224. The multiple substrate wirings 14 in accordance with each of the multiple wiring patterns 32 are formed on the wiring substrate 11. These multiple wiring patterns 32 and the multiple substrate wirings 14 are electrically connected.

In the following, in order to simplify the description, the wiring pattern 32 and the substrate wiring 14 electrically connected with each other may be collectively referred to as a voltage detection line.

As shown in FIG. 1, a second electronic element 60 is mounted on the flexible substrate 31. The second electronic element 60 includes a fuse 61 and an inductor 62. The monitoring portion 10 includes, as the first electronic element 12, a Zener diode 15, a parallel capacitor 16, and a resistor 17. Each of the Zener diode 15, the parallel capacitor 16, and the resistor 17 is mounted on the wiring substrate 11.

As shown in FIG. 1, the fuse 61, the inductor 62, and the resistor 17 are placed in each of the multiple voltage detection lines. The fuse 61, the inductor 62, and the resistor 17 are connected in series in order from the battery cell 220 to the monitoring IC chip 13.

Each of the Zener diode 15 and the parallel capacitor 16 is connected in parallel between the two voltage detection lines aligned in order of potential. Specifically, the Zener diode 15 and the parallel capacitor 16 are connected between the inductor 62 and the resistor 17 in the voltage detection line. An anode electrode of the Zener diode 15 is connected with the lower potential side of the two adjacent voltage detection lines. A cathode electrode of the Zener diode 15 is connected with the high potential side of the two adjacent voltage detection lines.

In the connection configuration, the resistor 17 and the parallel capacitor 16 configure a RC circuit. The RC circuit and the inductor 62 functions as a filter reducing noise at a time of the voltage detection.

The Zener diode 15 has a structure in which a short failure occurs when an overvoltage is applied from the battery module 200. Specifically, the Zener diode 15 has a structure in which a PN junction type IC chip is directly sandwiched by a pair of leads. Thereby, for example, unlike a configuration where the IC chip and the lead are indirectly connected by the wire, the Zener diode 15 may be possible to avoid an open failure caused by a breakage of the wire due to application of overvoltage.

The fuse 61 is broken due to a large current flowing in the voltage detection line when the overvoltage causes the short failure of the Zener diode 15. The rated current of the fuse 61 is set to a standard of the large current flowing in the voltage detection line when the overvoltage causes the short failure of the Zener diode 15. The breakage of the fuse 61 prevents the flow of the large current into the monitoring IC chip 13.

As shown in FIG. 1, the monitoring IC chip 13 includes a driver 18 that executes a signal process such as amplification, and a switch 19 in accordance with each of the multiple battery cells 220. The switch 19 controls an electrical connection between two voltage detection lines aligned in order of potential. One end of the switch 19 is connected with the wiring of the monitoring IC chip 13 connected with one of the two voltage detection lines aligned in order of potential. The other end of the switch 19 is connected with the wiring of the monitoring IC chip 13 connected with the other of the two voltage detection lines aligned in order of potential. The switching control of the switch 19 controls charging/discharging of the battery cell 220 electrically connected with the two voltage detection lines connected with the switch 19.

As shown in FIG. 1, the monitoring IC chip 13 is electrically connected with each of the multiple voltage detection lines. Accordingly, the monitoring IC chip 13 receives the output voltage of each of the multiple battery cells 220. The monitoring IC chip 13 outputs the output voltage (electromotive voltage) of each of the multiple battery cells 220 to the battery ECU 300.

There is a correlation between the state of charge (SOC) and the electromotive voltage of the battery cell 220. The battery ECU 300 stores the correlation. The battery ECU 300 detects the SOC of each of the multiple battery cells 220 based on the stored correlation and the output voltage (electromotive voltage) input from the monitoring IC chip 13.

The battery ECU 300 determines the equalization process of the SOCs of the multiple battery cells 220, based on the detected result. The battery ECU 300 outputs instruction of the equalization process based on the determination, to the driver 18 of the monitoring IC chip 13. The driver 18 follows the instruction of the equalization process to perform the switching control of the switch 19 in accordance with each of the multiple battery cells 220. Thereby, the multiple battery cells 220 charge and discharge. The SOCs of the multiple battery cells 220 are equalized.

The battery ECU 300 detects a charge state of the battery stack 210 based on the input voltage or the like. The battery ECU 300 outputs the detected charge state of the battery stack 210 to the in-vehicle ECU. The in-vehicle ECU outputs an instruction signal to the battery ECU 300 based on the charge state, vehicle information such as a depression amount of an accelerator pedal, a throttle valve opening that are input from the various sensors mounted on the vehicle, an ignition switch, or the like. The battery ECU 300 controls the connection between the battery stack 210 and the electrical load based on the instruction signal.

A system main relay (not shown) is placed between the battery stack 210 and the electrical load. The system main relay controls the electrical connection between the battery stack 210 and the electrical load by generation of a magnetic field. The battery ECU 300 controls the connection between the battery stack 210 and the electrical load by controlling the generation of the magnetic field of the system main relay.

(Configuration of Monitoring Portion)

A configuration of the monitoring portion 10 will be described with reference to FIG. 3 and FIG. 4. In order to avoid complication of the description, in FIG. 3, a reference number of a configuration element of the battery stack 210 is omitted. FIG. 4 shows a cross-sectional shape of the monitoring apparatus 100 in order to clearly show a slit 36 and an arm 37. The omitting or the like will be similarly applied to the other side surface views.

The monitoring portion 10 includes the wiring substrate 11, the first electronic element 12, and the monitoring IC chip 13. The monitoring IC chip 13 is mounted on a front surface 11a of the wiring substrate 11. The first electronic element 12 is mounted on at least one of the front surface 11a or a back surface 11b of the wiring substrate 11, the back surface 11b being a backside of the front surface 11a.

The monitoring portion 10 includes a resin portion 20 in addition to these configuration elements. The resin portion 20 covers and protects the wiring substrate 11, and the first electronic element 12 and the monitoring IC chip 13 that are mounted on the wiring substrate 11. The resin portion 20 covers and protects the connection part of the wiring substrate 11 with the wiring portion 30.

Figure 3:
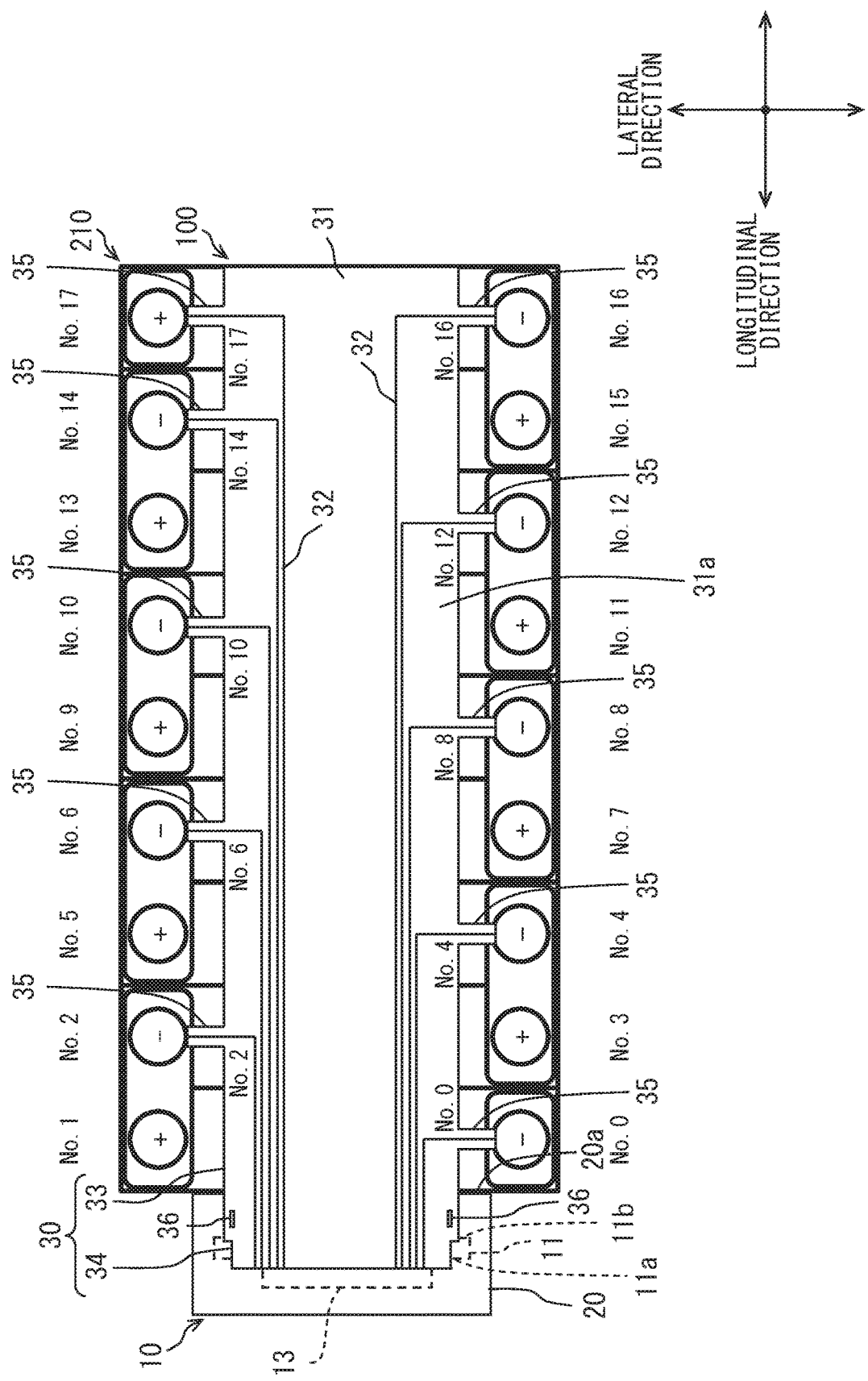
FIG. 3 is a top view illustrating a state where a monitoring apparatus is placed on the battery stack.
Figure 4:
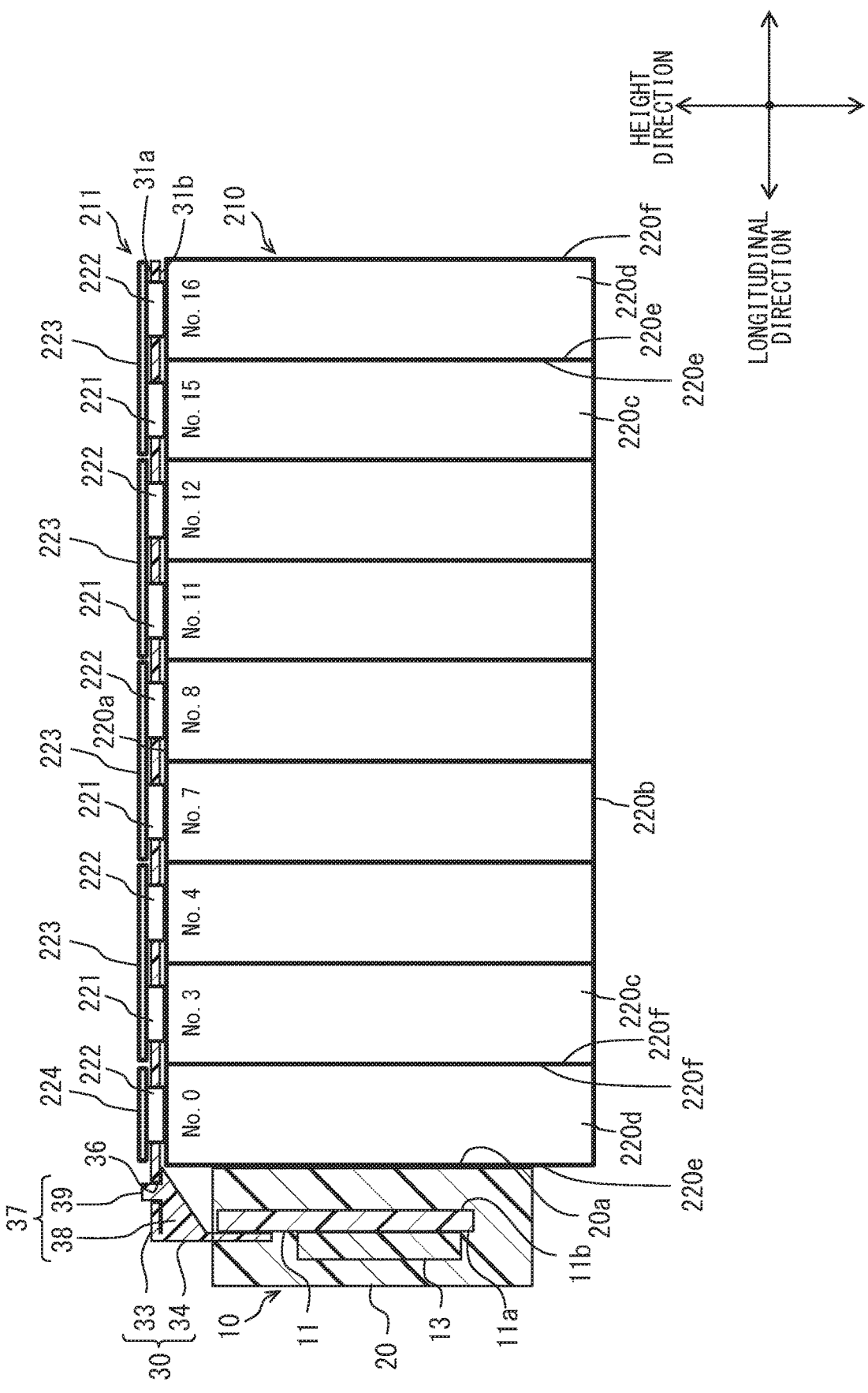
FIG. 4 is a side surface view illustrating a state where a monitoring apparatus is placed on the battery stack.

As shown in FIG. 3 and FIG. 4, the resin portion 20 has a rectangular parallelepiped shape. The resin portion 20 includes a mounting surface 20a facing in the longitudinal direction. As shown in FIG. 4, the monitoring portion 10 in the embodiment is placed on a first main surface 220e of the battery cell 220 positioned at an end of nine battery cells 220 aligned in the longitudinal direction. The mounting surface 20a of the resin portion 20 faces the first main surface 220e in the longitudinal direction.

The resin portion 20 may be omitted. When the monitoring portion 10 does not have the resin portion 20, the back surface 11b of the wiring substrate 11 faces the first main surface 220e in the longitudinal direction. The wiring substrate 11 is fixed to the first main surface 220e. The first main surface 220e corresponds to a side surface.

(Configuration of Wiring Portion)

The configuration of the wiring portion 30 will be described with reference to FIG. 3 to FIG. 7. The wiring portion 30 includes the flexible substrate 31 and the wiring pattern 32. The flexible substrate 31 is thinner than the wiring substrate 11 and made of a flexible resin material. Therefore, the flexible substrate 31 can be bent. That is, the flexible substrate 31 is elastically deformable.

A part of the flexible substrate 31 may have a notch or a bellows structure so as to largely deform in the longitudinal direction and the lateral direction (not shown). The flexible substrate 31 may have the notch or a hole in order to avoid prevention of a wind flow in the accommodation space formed by the battery case.

The wiring pattern 32 is formed on a front surface 31a of the flexible substrate 31. A coating resin covers the wiring pattern 32. A tip toward an end of the wiring pattern 32 is exposed to the outside of each of the flexible substrate 31 and the coating resin. The tip toward one end of the wiring pattern 32 is mechanically and electrically connected with the series terminal 223 and the output terminal 224 by welding or the like. A tip toward the other end of the wiring pattern 32 is mechanically and electrically connected with the substrate wiring 14 of the wiring substrate 11 by solder or the like.

The series terminal 223 and the output terminal 224 are connected with at least one of the positive electrode terminal 221 or the negative electrode terminal 222 placed on the upper end surface 220a of the battery cell 220. The monitoring portion 10 is placed on the first main surface 220e of the battery cell 220.

The wiring portion 30 connects the series terminal 223 and the output terminal 224 placed on the upper end surface 220a with the monitoring portion 10 placed on the first main surface 220e. Therefore, a part of the wiring portion 30 is placed toward the upper end surface 220a. The other part of the wiring portion 30 is placed toward the monitoring portion 10. The wiring portion 30 is bent (also referred to as not flat) at a boundary between a part placed toward the upper end surface 220a and a part placed toward the monitoring portion 10.

In the following, in order to simplify the description, when the bent portion of the wiring portion 30 is set to the boundary, a part positioned toward the upper end surface 220a may be referred to as a first wiring portion 33, and a part positioned toward the monitoring portion 10 may be referred to as a second wiring portion 34. The first wiring portion 33 corresponds to a first flexible substrate. The second wiring portion 34 corresponds to a second flexible substrate.

Figure 6:
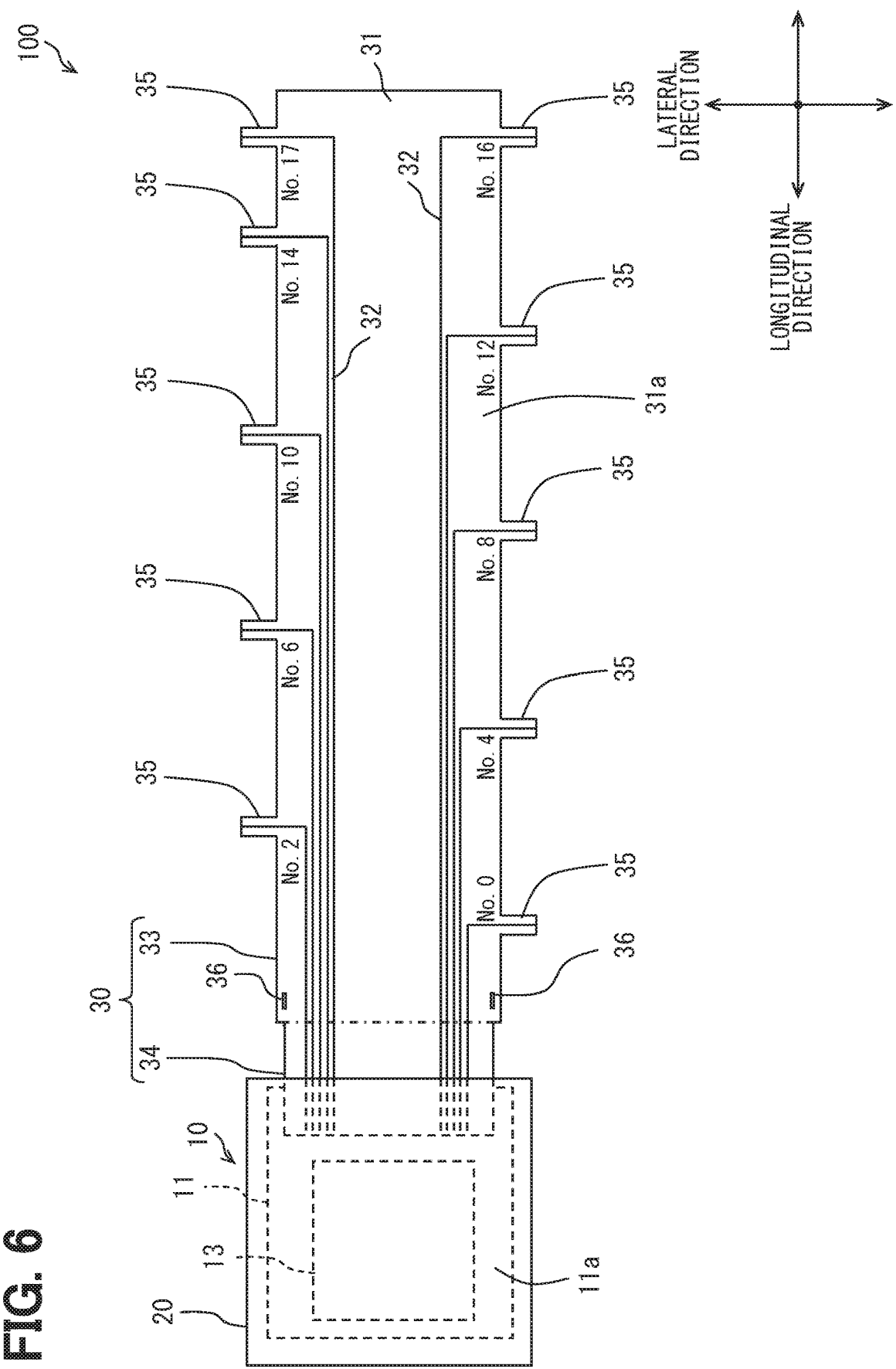
FIG. 6 is a top view illustrating a state where an arm is bent.

A boundary of a bent part in the wiring portion 30 may be not ideally shown by a straight line. In principle, the bent portion which is continuously bent, at least, exists between the first wiring portion 33 and the second wiring portion 34. However, in order to simplify the description in the embodiment, the boundary between the first wiring portion 33 and the second wiring portion 34 is simply shown by a dashed dotted line, as shown in FIG. 6.

(First Wiring Portion)

The first wiring portion 33 has a shape extending in the longitudinal direction. A part of the first wiring portion 33 is placed between the first electrode terminal group 211 and the second electrode terminal group 212 on the upper end surface 220a of the multiple battery cells 220. The other part of the first wiring portion 33 protrudes from the upper end surface 220a and faces apart from the monitoring portion 10 in the height direction.

Multiple protrusions 35 extending toward the electrode terminal group are formed in a part placed between the first electrode terminal group 211 and the second electrode terminal group 212 in the flexible substrate 31 of the first wiring portion 33. These multiple protrusions 35 are aligned apart from each other in the longitudinal direction.

One end of the wiring pattern 32 is placed on the multiple protrusions 35. A tip toward the one end of the wiring pattern 32 is exposed to the outside of the coating resin and the flexible substrate 31 configuring the protrusion 35. The tip toward the one end of the wiring pattern 32 is connected with the series terminal 223 or the output terminal 224.

The slit 36 penetrating the front surface 31a of the flexible substrate 31 and a back surface 31b that is the backside side is formed in a part of the flexible substrate 31 of the first wiring portion 33, the portion facing apart from the monitoring portion 10. The arm 37 is inserted into The slit 36 to be fixed.

In the embodiment, the two slits 36 are formed in the first wiring portion 33. The two slits 36 are aligned apart from each other in the lateral direction. An opening of the slit 36 has a rectangular shape. The opening has a length in the longitudinal direction longer than in the lateral direction. A configuration in which the length in the lateral direction is longer than in the longitudinal direction can be employed to the opening of the slit 36. The number of slits 36 is not limited to two.

(Second Wiring Portion)

The second wiring portion 34 has a shape extending in the height direction. A part of the second wiring portion 34 is placed in the monitoring portion 10. The other part of the second wiring portion 34 is aligned in the longitudinal direction apart from the first main surface 220e placed on the monitoring portion 10.

The second wiring portion 34 has a length in the extension direction shorter than that of the first wiring portion 33. That is, the second wiring portion 34 has a length in the height direction shorter than the length of the first wiring portion 33 in the longitudinal direction. In other words, the length that the first wiring portion 33 has in the longitudinal direction is longer than the length that the second wiring portion 34 has in the height direction.

The other end of the wiring pattern 32 is placed on a part of the second wiring portion 34 in the flexible substrate 31, the part being placed in the monitoring portion 10. The tip toward the other end of the wiring pattern 32 is exposed to the outside of the coating resin and the flexible substrate 31.

The tip toward the other end of the wiring pattern 32 is connected with the substrate wiring 14 formed on the front surface 11a of the wiring substrate 11. The flexible substrate 31 is linked with the front surface 11a of the wiring substrate 11. The tip toward the other end of the wiring pattern 32 and the flexible substrate 31 may be linked with the back surface 11b of the wiring substrate 11.

It may be possible to employ also a configuration in which the tip toward the other end of the wiring pattern 32 is not exposed to the outside of the coating resin and the flexible substrate 31. In the case, a via for electrically connecting the other end of the wiring pattern 32 with the substrate wiring 14 is formed in the part of the second wiring portion 34 on the flexible substrate 31, the part being placed in the monitoring portion 10. The via functions to electrically connect the front surface 31a with the back surface 31b of the flexible substrate 31. The wiring pattern 32 and the substrate wiring 14 are electrically connected by the via due to the connection between the via and the substrate wiring 14.

Figure 5:
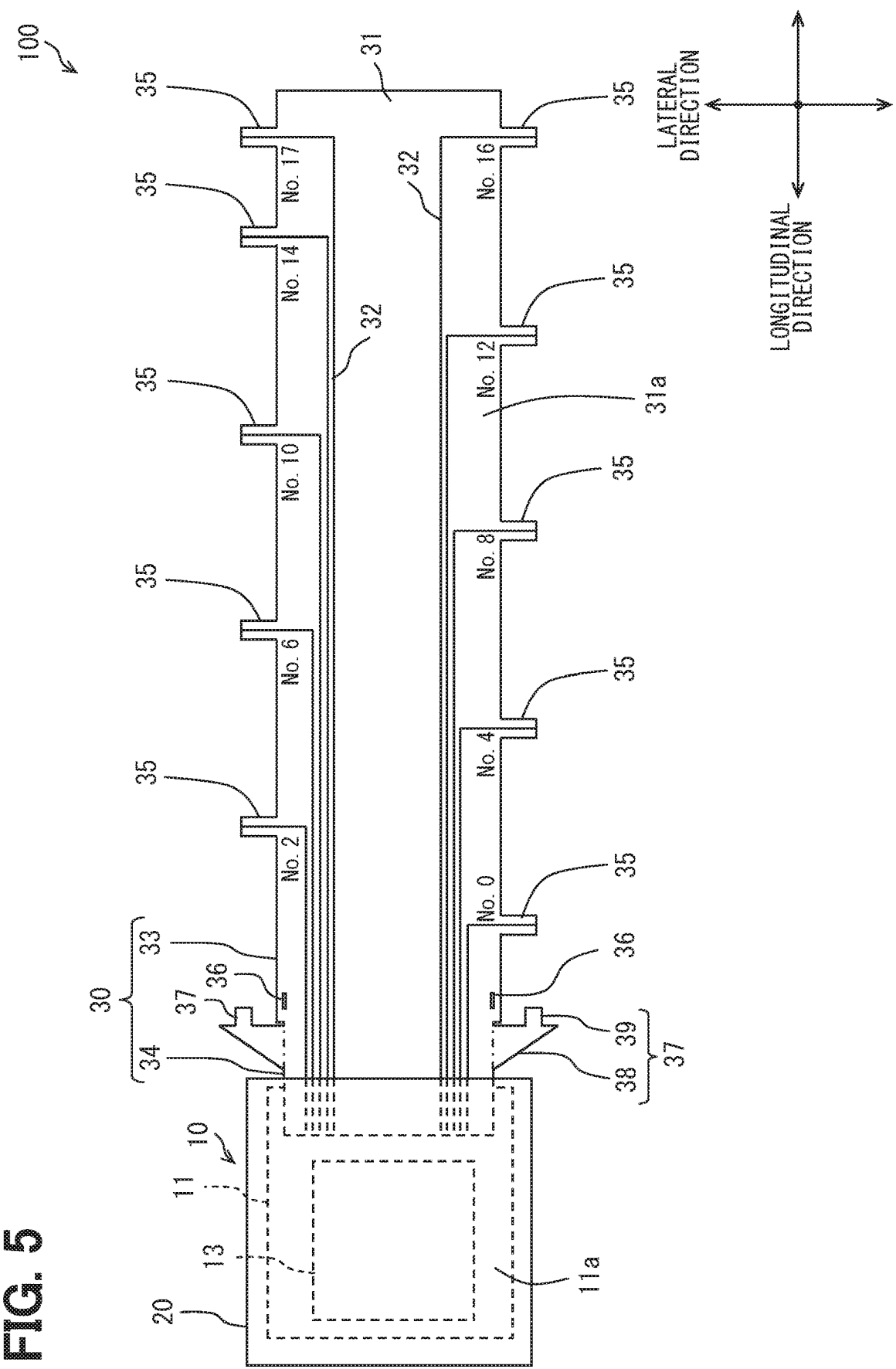
FIG. 5 is a top view illustrating a monitoring apparatus according to a first embodiment.

The arm 37 inserted into the slit 36 to be fixed is formed in the part facing apart from the first main surface 220e in the longitudinal direction, the part of the second wiring portion 34 on the flexible substrate 31 being placed in the monitoring portion 10. As shown in FIG. 5, a length of the second wiring portion 34 in the lateral direction is shorter than the first wiring portion 33. The two sides of the second wiring portion 34 along the longitudinal direction are aligned with the two slits 36 in the longitudinal direction. The arms 37 extend from these two sides of the second wiring portion 34. The number of arms 37 is not limited to two.

The arm 37 includes a support portion 38 and an insertion portion 39. The support portion 38 integrally extends from the side of the second wiring portion 34. The insertion portion 39 is integrally linked with the support portion 38.

As shown in FIG. 4, the support portion 38 has a right triangle shape. One of two sides forming the right angle of the support portion 38 is integrally linked with the flexible substrate 31 of the second wiring portion 34. The other of two sides forming the right angle of the support portion 38 is integrally connected with the back surface 31b of the flexible substrate 31 of the first wiring portion 33.

The insertion portion 39 extends in the height direction from the side of the first wiring portion 33 of the support portion 38, the side of the first wiring portion 33 contacted with the back surface 31b of the flexible substrate 31. A part of the insertion portion 39 is inserted into the slit 36. The part of which the insertion portion 39 is inserted into the slit 36, and is fixed to the first wiring portion 33 by an adhesive, a solder, welding, or the like. Not only the insertion portion 39 but also the support portion 38 may be fixed to the first wiring portion 33.

As described above, the two sides forming the right angle of the support portion 38 of the arm 37 are linked with the second wiring portion 34 and the first wiring portion 33. The arm 37 and the slit 36 function as a rib for reinforcing the connection between the first wiring portion 33 and the second wiring portion 34.

(Assembly)

A process flow of assembling the monitoring apparatus 100 to the battery stack 210 will be described. FIG. 5 shows the monitoring apparatus 100 before the monitoring apparatus 100 is assembled with the battery stack 210. The wiring portion 30 is not bent at the time. The wiring portion 30 has a shape extending in the longitudinal direction. The arm 37 extends laterally away from the flexible substrate 31.

Each of the two arms 37 is bent toward the back surface 31b of the flexible substrate 31 along a dashed dotted line shown in FIG. 5 as a fold line. Thereby, the two arms 37 extend away from the back surface 31b along the height direction. The lateral position of the insertion portion 39 of the arm 37 coincides with the lateral position of the slit 36.

Figure 7:
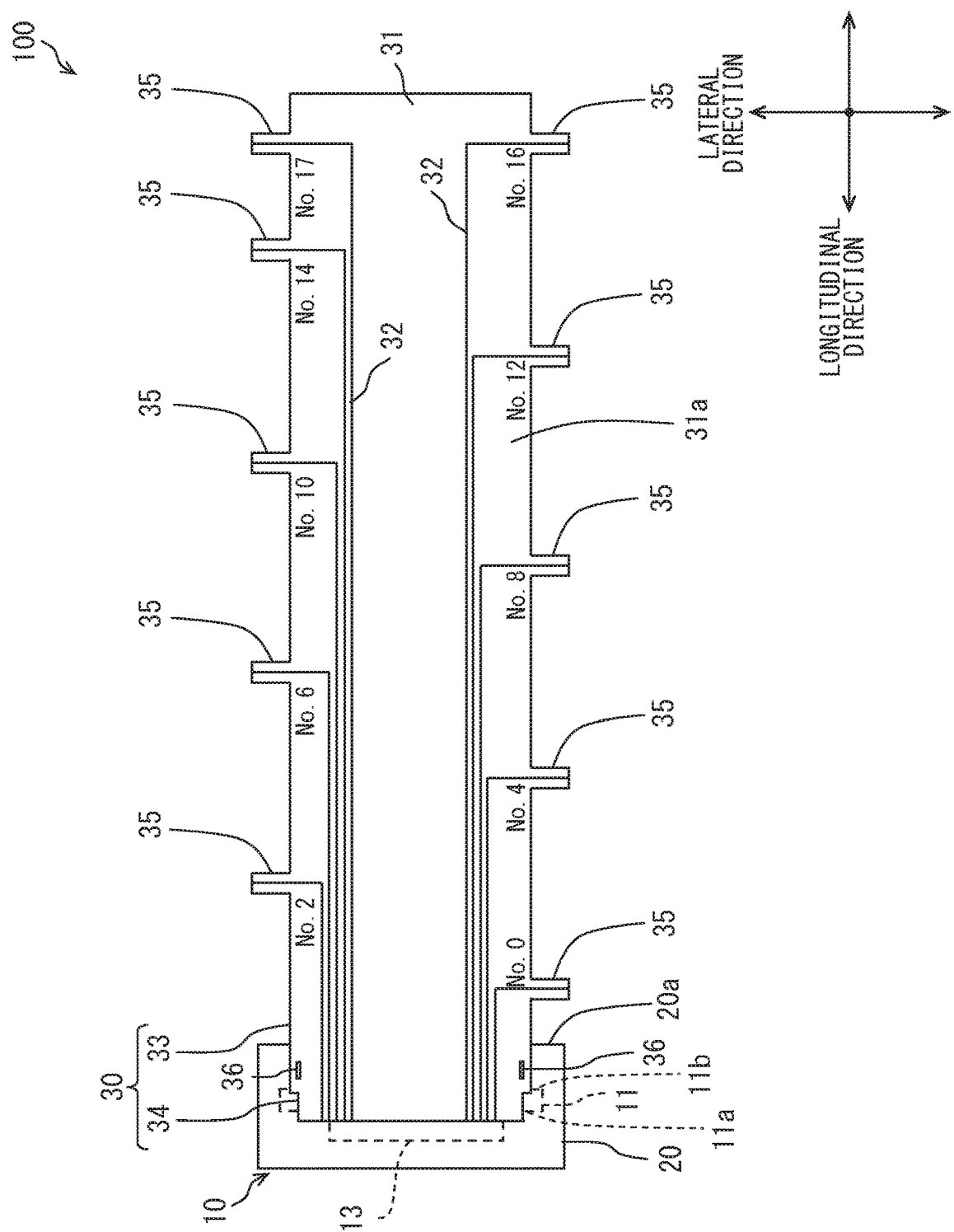
FIG. 7 is a top view illustrating a wiring portion in a bent state.

The second wiring portion 34 is bent toward the back surface 31b of the flexible substrate 31 of the first wiring portion 33 along a dashed dotted line shown in FIG. 6 as a fold line. As a result, as shown in FIG. 4 and FIG. 7, the second wiring portion 34 extends in the height direction. As shown in FIG. 4, the wiring portion 30 (the monitoring apparatus 100) has a shape bent in an L shape. The wiring portion 30 is bent in accordance with the outer shape of the battery stack 210. The wiring portion 30 is not bent in a direction apart from the battery stack 210 but is bent in a direction approaching to the battery stack 210.

At the time, the insertion portion 39 of the arm 37 is inserted into the slit 36. Then, the insertion portion 39 is mechanically connected with the first wiring portion 33. Thereby, bent states of the first wiring portion 33 and the second wiring portion 34 are maintained. The L shaped bent state of the monitoring apparatus 100 is maintained.

As shown in FIG. 3, the first wiring portion 33 is placed on the upper end surface 220a of the multiple battery cells 220. Together with this, as shown in FIG. 4, the mounting surface 20a of the resin 20 is placed on the first main surface 220e. One end of the wiring pattern 32 is connected with the series terminal 223 and the output terminal 224.

The monitoring apparatus 100 is assembled to the battery stack 210. The wiring portion 30 may be bent after the one end of the wiring pattern 32 is connected with the series terminal 223 and the output terminal 224.

The operation effect of the monitoring apparatus 100 will be described. As described above, the wiring portion 30 is bent. At the bent part, the wiring portion 30 is divided into the first wiring portion 33 and the second wiring portion 34. The first wiring portion 33 extends in the longitudinal direction. The second wiring portion 34 extends in the height direction.

The multiple battery cells 220 are aligned in the longitudinal direction. The first main surface 220e and the second main surface 220f facing in the longitudinal direction of the battery cell 220 may easily expand. Therefore, the multiple battery cells 220 may easily expand in the longitudinal direction.

The first wiring portion 33 is placed on the upper end surface 220a of the multiple battery cells 220. The first wiring portion 33 is linked with each of the series terminal 223 and the output terminal 224 that are linked with the multiple battery cells 220. The length of the first wiring portion 33 in the longitudinal direction is longer than the length of the second wiring portion 34 in the height direction.

Due to the configuration described above, the first wiring portion 33 may easily expand and contract in the longitudinal direction. Due to the expansion and contraction, the stress concentration easily occurs at the linking part where the first wiring portion 33 and the second wiring portion 34 are linked in the bent state.

By contrast, in the monitoring apparatus 100, the slit 36 is formed in the first wiring portion 33. The arm 37 is formed in the second wiring portion 34. The arm 37 is mechanically connected to the slit 36. Thereby, the strength of the linking part where the first wiring portion 33 and the second wiring portion 34 are liked in the bent state is reinforced.

Accordingly, for example, even when the stress concentration occurs at the linking part due to the expansion and the contraction described above, it is prevented that the damage at the linking part occurs. It is prevented that a contact failure occurs at the wiring pattern 32 passing through the linking part. As the result, it may be possible to prevent the deterioration of the lifetime of the wiring portion 30.

As described above, the reinforcement of the bent part of the wiring portion 30 is performed by using the arm 37 and the slit 36. That is, the reinforcement of the bent part of the wiring portion 30 is performed by using a part of the configuration material of the wiring portion 30. Thereby, it may be possible to prevent an increase in the number of components, in comparison to a configuration in which the reinforcement of the bent part of the wiring portion 30 is performed by a material completely different from the wiring portion 30.

The slit 36 is formed in the first wiring portion 33 which may easily expand and contract in the longitudinal direction. Therefore, the fixed part between the arm 37 and the slit 36 is placed in the first wiring portion 33.

Thereby, the expansion and contraction of the first wiring portion 33 is divided into two by the fixed part between the arm 37 and the slit 36. The expansion and the contraction of the first wiring portion 33 reduce the stress applied to the linking part. Thereby, it may be possible to effectively prevent the deterioration of the lifetime of the wiring portion 30.

(First Modification)

Figure 8:
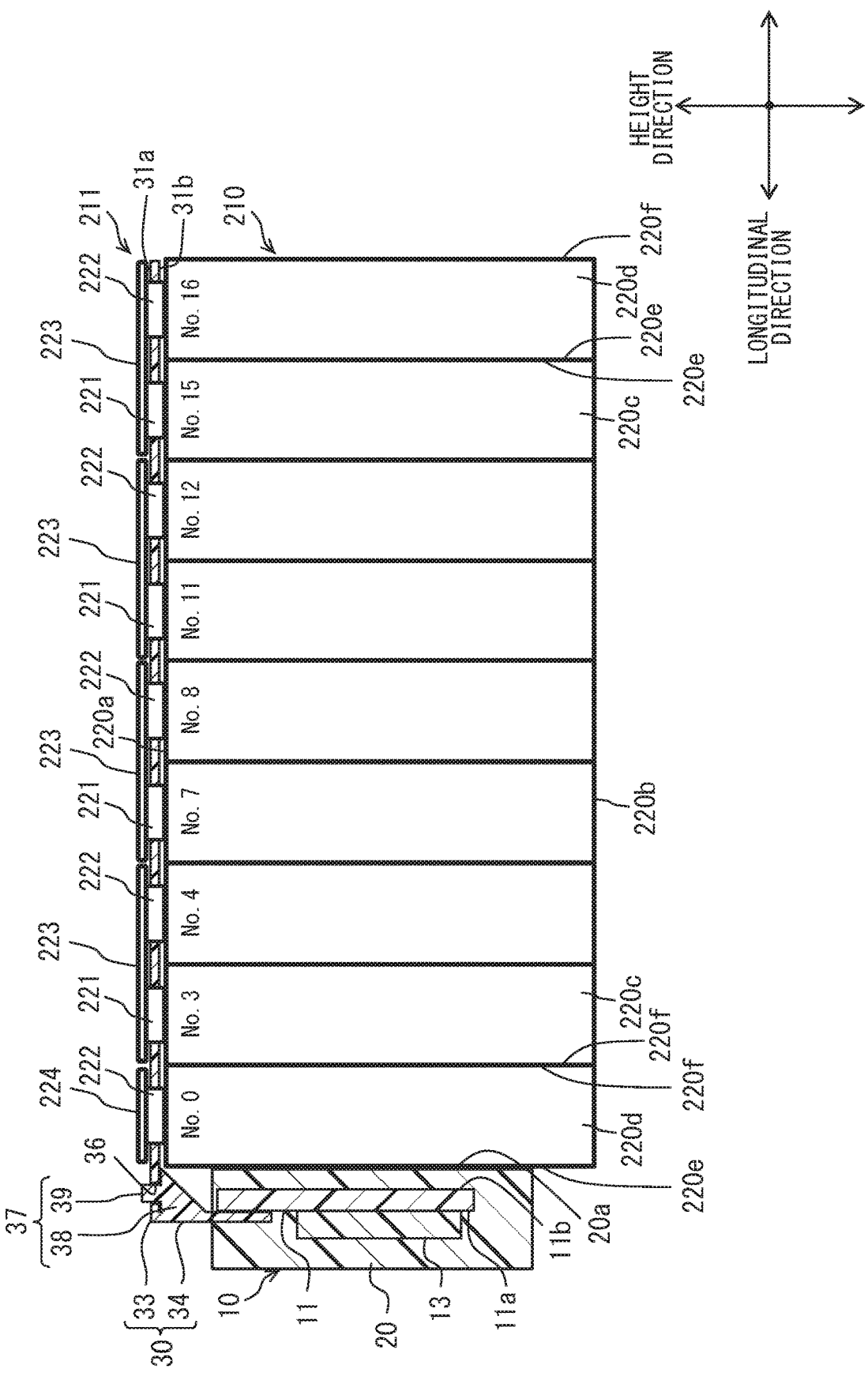
FIG. 8 is a side surface view describing a modification of the monitoring apparatus.

In the embodiment, it is exemplified that the length between the mounting surface 20a of the resin portion 20 and the back surface 11b of the wiring substrate 11 is longer than the length between the front surface 11a of the wiring substrate 11 and the back surface 11b of the wiring substrate 11 as shown in FIG. 4. However, it may be possible to employ a configuration in which the length between the mounting surface 20a of the resin portion 20 and the back surface 11b is shorter than the length between the front surface 11a of the wiring substrate 11 and the back surface 11b of the wiring substrate 11 as shown in FIG. 8. In the case, for the two sides forming the right angle of the support portion 38, a length of a side contacted to the back surface 31b of the flexible substrate 31 of the first wiring portion 33 is shorter than a length of a side integrally linked with the flexible substrate 31 of the second wiring portion 34. An increase in the size of monitoring apparatus 100 is prevented in the longitudinal direction.

(Second Modification)

Figure 9:
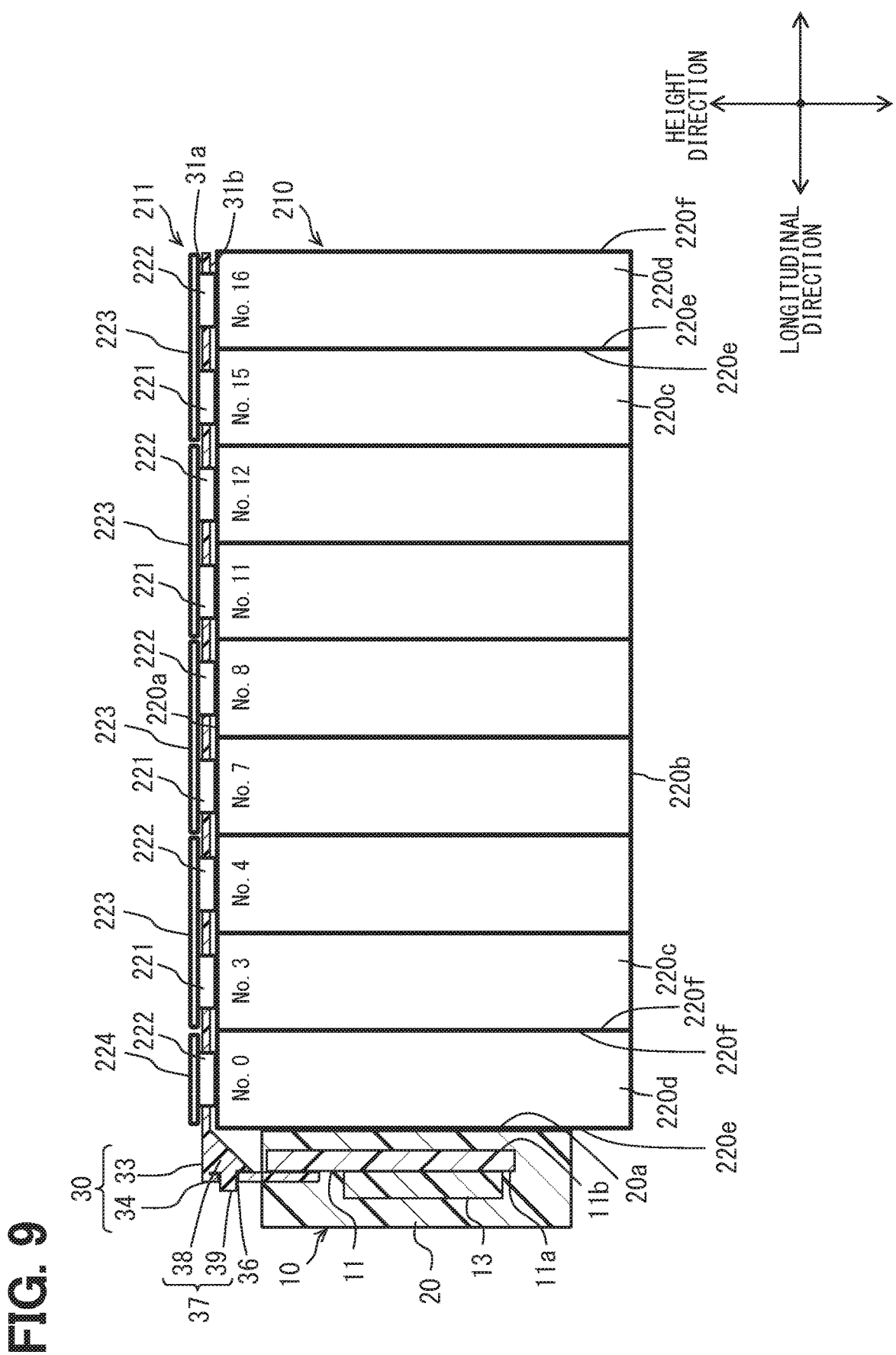
FIG. 9 is a side surface view describing a modification of the monitoring apparatus.

In the embodiment, it is exemplified that the slit 36 is formed in the first wiring portion 33 and the arm 37 is formed in the second wiring portion 34. However, as shown in FIG. 9, it may be possible to employ a configuration in which the arm 37 is formed in the first wiring portion 33 and the slit 36 is formed in the second wiring portion 34.

(Third Modification)

Figure 10:
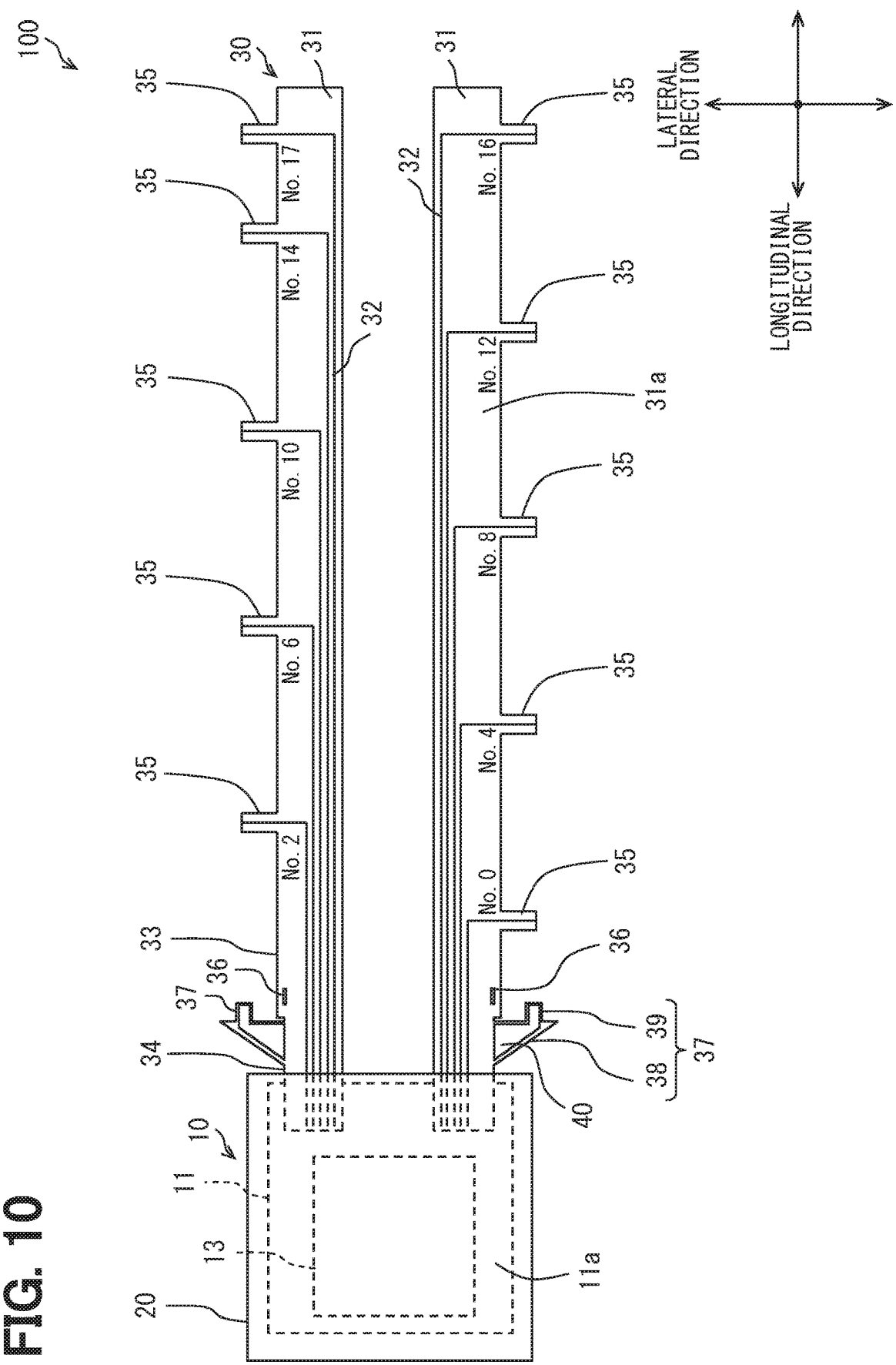
FIG. 10 is a top view illustrating a modification of the monitoring apparatus.

In the embodiment, it is exemplified that the wiring portion 30 includes on flexible substrate 31. However, as shown in FIG. 10, it may be possible to employ a configuration in which the wiring portion 30 includes two flexible substrates 31. In the modification, the two flexible substrates 31 are aligned apart from each other in the lateral direction. The wiring pattern 32 in accordance with the first electrode terminal group 211 is formed in one of the two flexible substrates 31. The wiring pattern 32 in accordance with the second electrode terminal group 212 is formed in the other of the flexible substrates 31.

(Fourth Modification)

As shown FIG. 10, it may be possible to employ a configuration on which a reinforcement material 40 having rigidity higher than a formation material of the flexible substrate 31 is placed in the arm 37. For example, copper or the like can be employed to the reinforcement material 40. The same material with the wiring pattern 32 can be employed to the reinforcement material 40.

The reinforcement material 40 described above improves the strength of the arm 37. Thereby, strength of the linking part where the first wiring portion 33 and the second wiring portion 34 are linked may be more effectively improved. The reinforcement material 40 may be placed on, at least, the support portion 38. The reinforcement material 40 may not be inserted into the insertion portion 39.

Second Embodiment

A second embodiment will be described with reference to FIGS. 11 to 16. A monitoring apparatus according to each of embodiments described below has many similarities to the embodiment described above. Therefore, hereinafter, a description of a similar part will be omitted. A different part will be mainly described. Hereinafter, a same reference number will be applied to a same element as the element described above.

Figure 11:
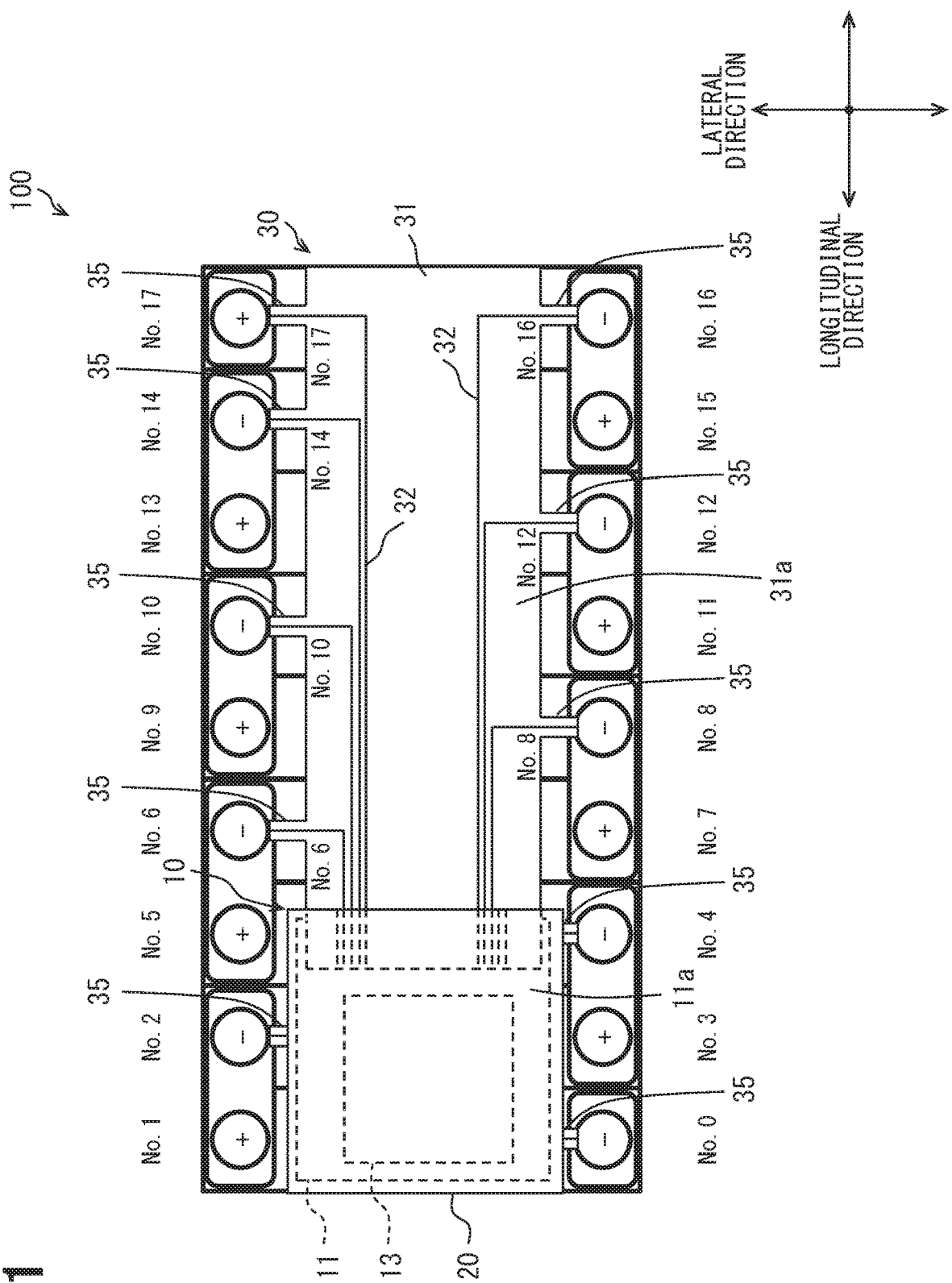
FIG. 11 is a top view illustrating a state where the monitoring apparatus is placed on the battery stack.
Figure 12:
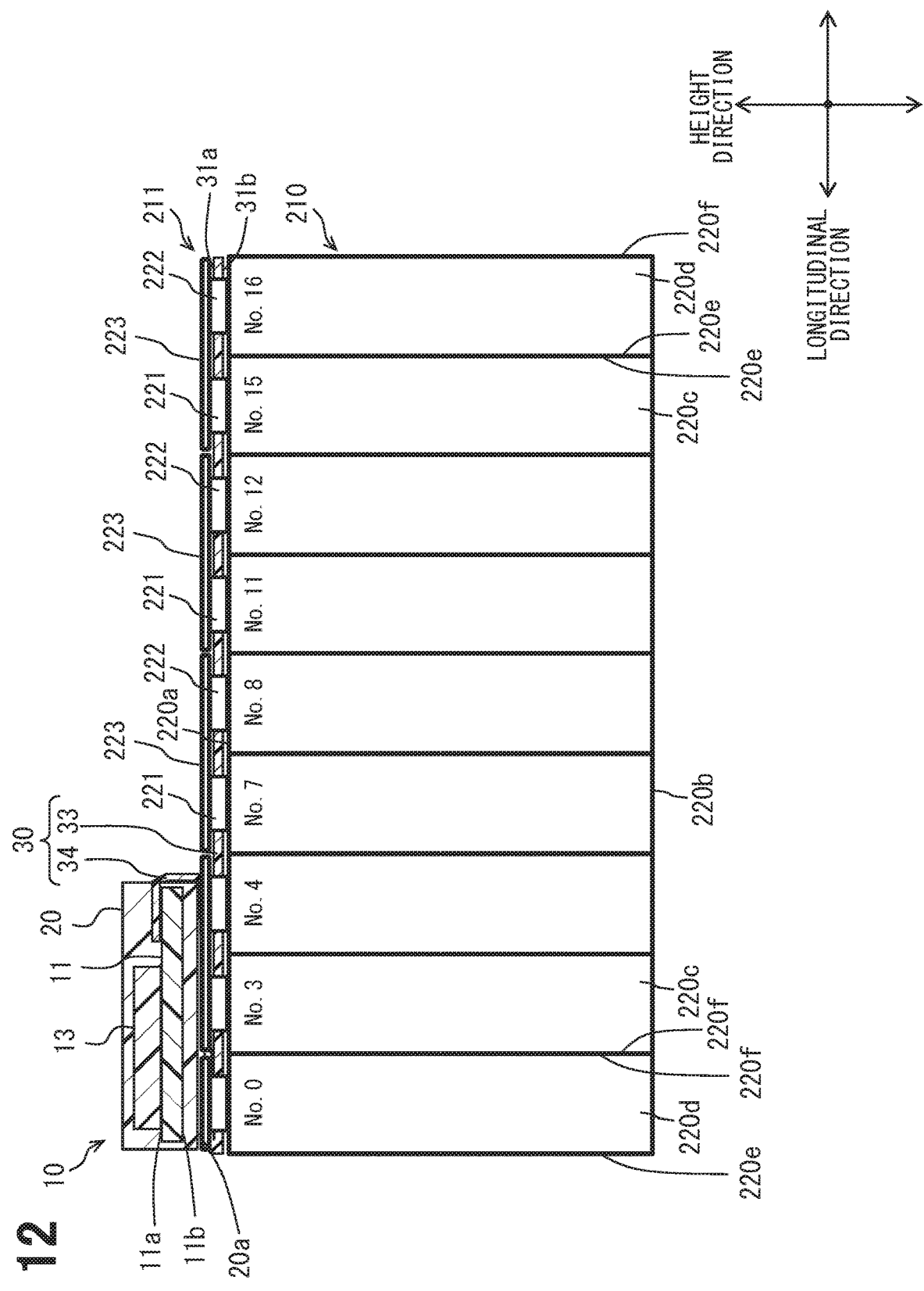
FIG. 12 is a side surface view illustrating a state where the monitoring apparatus is placed on the battery stack.

In the first embodiment, it is exemplified that the monitoring portion 10 is placed on the first main surface 220e. By contrast, in the embodiment, the monitoring portion 10 is placed on the upper end surface 220a, as shown in FIG. 11 and FIG. 12.

In order to employ the according configuration, not only the boundary between the first wiring portion 33 and the second wiring portion 34 but also the second wiring portion 34 are bent, as described below. The support portion 38 of the arm 37 in the embodiment has a rectangular shape extending away from the second wiring portion 34. The insertion portion 39 has a rectangular shape including a length in an orthogonal direction to an extension direction of the support portion 38, the length being longer than a length of the support portion 38 in the orthogonal direction.

Figure 13:
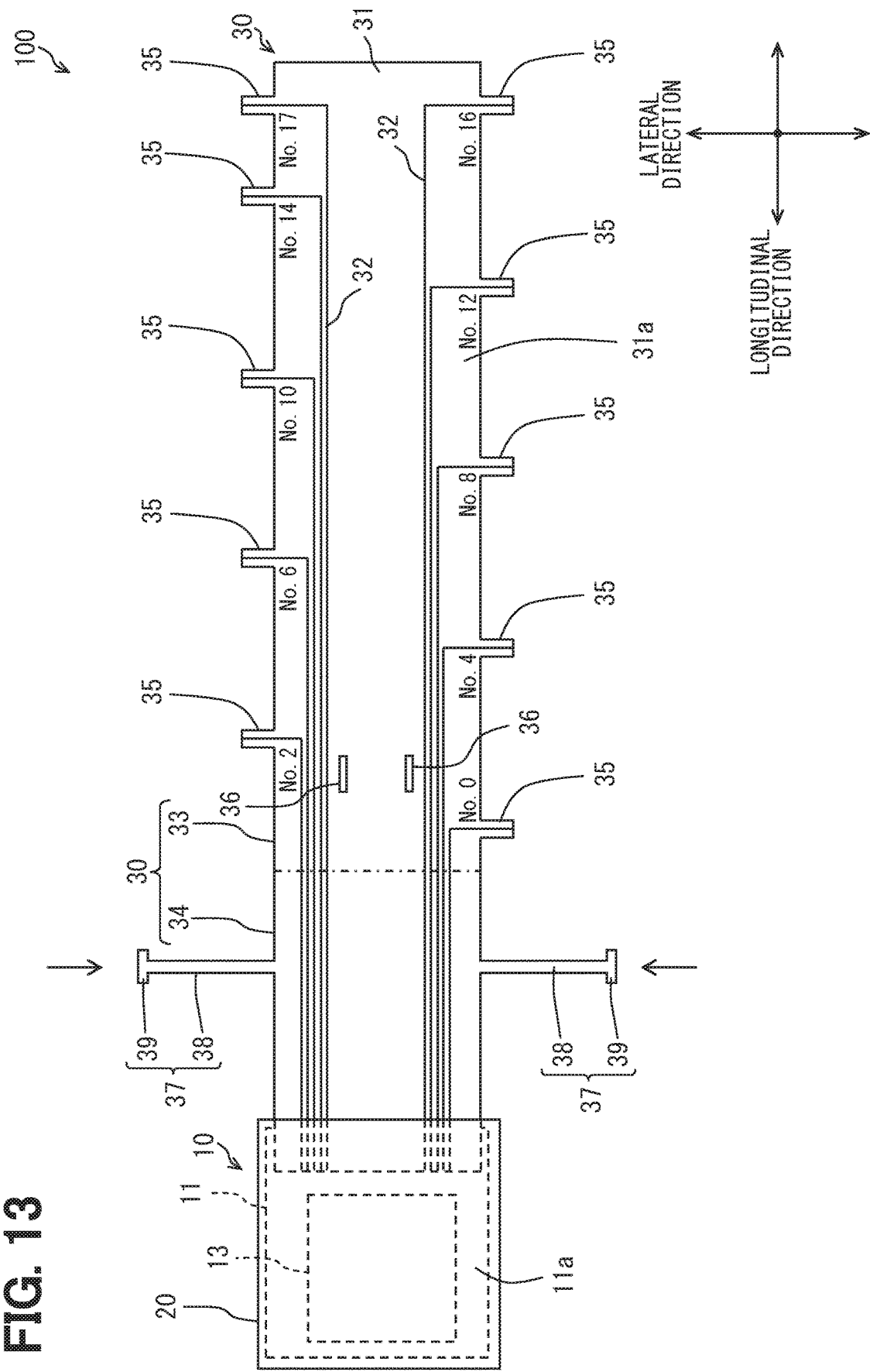
FIG. 13 is a top view illustrating a monitoring apparatus according to a second embodiment.

FIG. 13 shows the monitoring apparatus 100 before the monitoring apparatus 100 is assembled with the battery stack 210. In the state, the support portion 38 extends in the lateral direction. The insertion portion 39 extends in the longitudinal direction at a tip of the support portion 38.

As shown by an arrow in FIG. 13, each of the two arms 37 is bent to face the front surface 31a of the flexible substrate 31. Each of the two arms 37 is bent to be separated from the front surface 31a. Thereby, the insertion portion 39 toward the tip of the support portion 38 in the arm 37 extends away from the front surface 31a along the height direction. The lateral position of the insertion portion 39 coincides with the lateral position of the slit 36.

Figure 14:
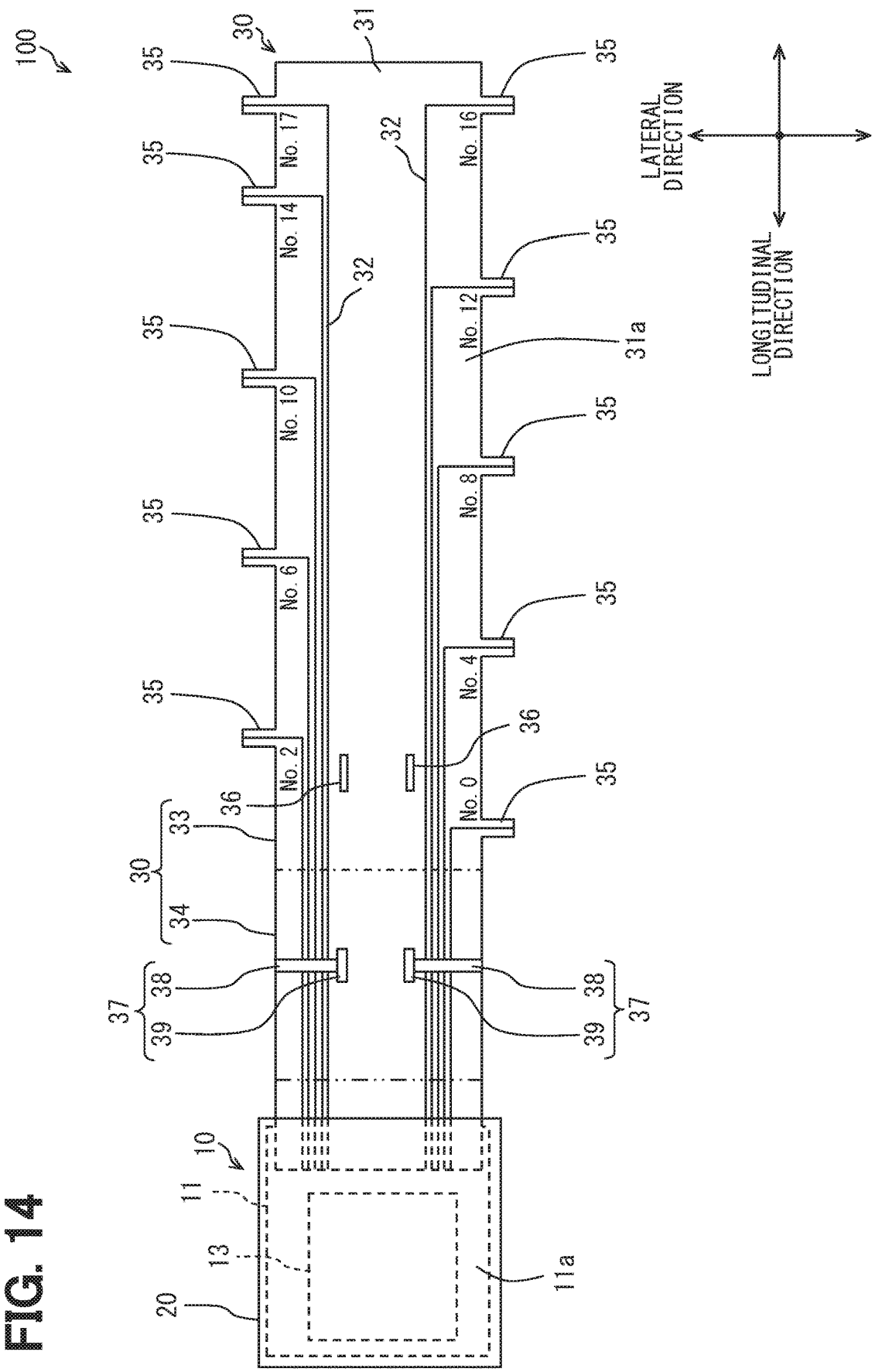
FIG. 14 is a top view illustrating a state where the arm is bent.
Figure 15:
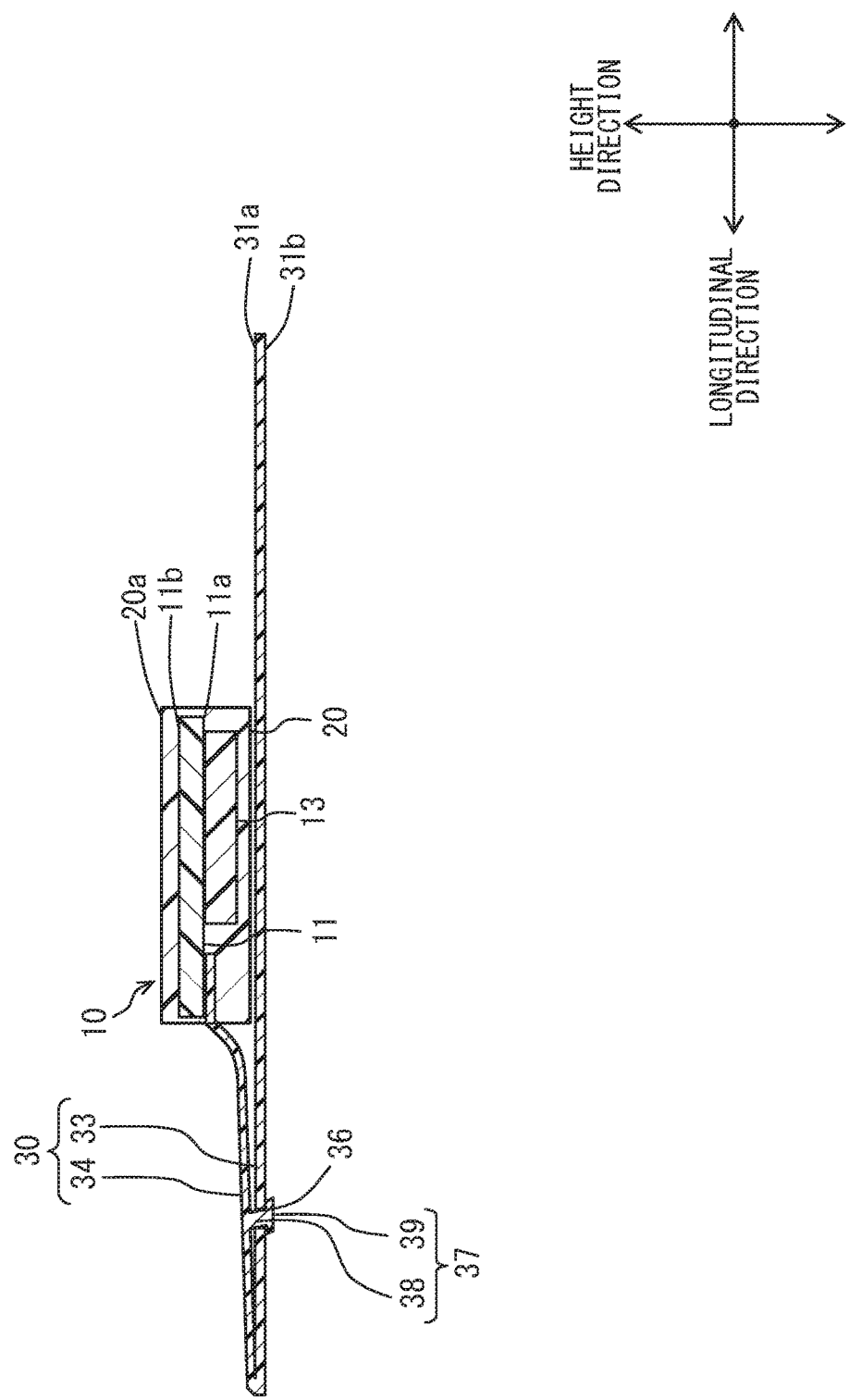
FIG. 15 is a side surface view illustrating a state where the wiring portion is bent once.

The second wiring portion 34 is bent toward the front surface 31a of the flexible substrate 31 of the first wiring portion 33 along a dashed dotted line shown in FIG. 14 as a fold line. Thereby, as shown in FIG. 15, the second wiring portion 34 and the monitoring portion 10 face the first wiring portion 33 in the height direction.

At the time, the insertion portion 39 is inserted into the slit 36. The insertion portion 39 is mechanically connected with the first wiring portion 33. Thereby, the bent state of the first wiring portion 33 and the second wiring portion 34 is maintained.

Figure 16:
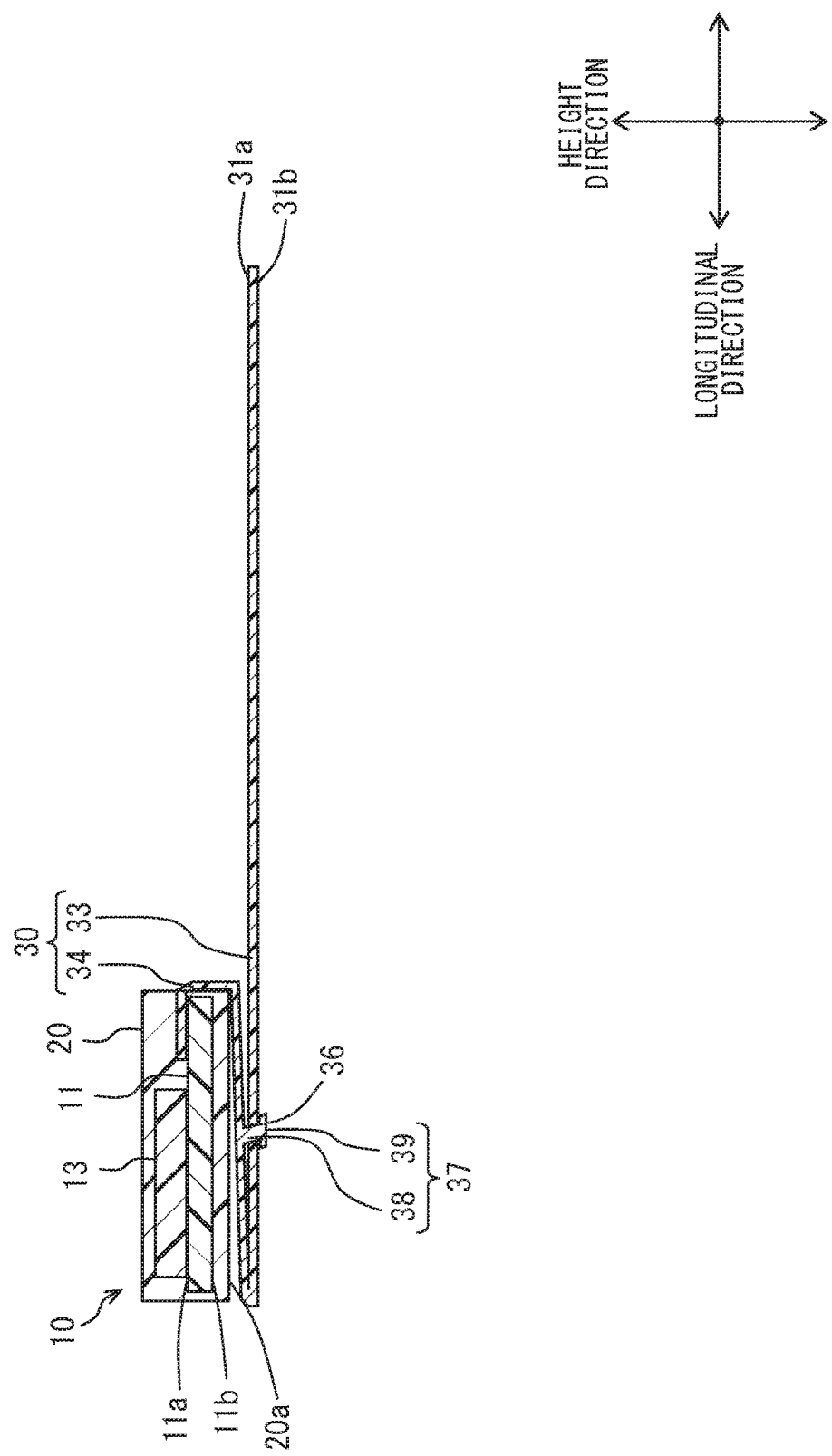
FIG. 16 is a side surface view illustrating a state where the wiring portion is bent twice.

The second wiring portion 34 is bent so that the monitoring portion 10 is toward the back surface 31b of the flexible substrate 31 of the second wiring portion 34 along a long dashed double-dotted shown in FIG. 14 as a fold line. Thereby, as shown in FIG. 16, the monitoring portion 10 faces the second wiring portion 34 in the height direction. As shown in FIG. 12, the first wiring portion 33, the second wiring portion 34, and the monitoring portion 10 are overlapped on the upper end surface 220a of the multiple battery cells 220.

The monitoring apparatus 100 in the embodiment includes the similar configuration element to the monitoring apparatus 100 described in the first embodiment. Therefore, the similar effect can be provided.

While the embodiments of the present disclosure have been described above, the present disclosure is not limited to the embodiments described above, and may be carried out with various modifications without departing from the scope of the present disclosure.

(Fifth Modification)

In the embodiment, it is exemplified that the fuse 61 and the inductor 62 are placed on the flexible substrate 31. By contrast, it may be possible to employ a configuration in which the Zener diode 15, the parallel capacitor 16, and the resistor 17 are placed on the flexible substrate 31 in addition to the fuse 61 and the inductor 62, for example.

(Sixth Modification)

In the embodiment, it is exemplified that the wiring pattern 32 is placed on the front surface 31a. However, it may be possible to employ a configuration in which the wiring pattern 32 is placed on the back surface 31b.

(Seventh Modification)

In each of the embodiments, it is exemplified that the battery stack 210 has nine battery cells 220. However, the number of the battery cells 220 of the battery stack 210 is not limited to the example described above, and may be plural. The battery stack 210 may have an even number of battery cells 220.

In each of the embodiments, it is exemplified that the battery module 200 has one battery stack 210. However, the battery module 200 may have multiple battery stacks 210. In the case, the housing of the battery module 200 includes the accommodation spaces in accordance with each of the battery stacks 210. These multiple accommodation spaces are aligned in the lateral direction.

For example, when the battery cells 220 of two battery stacks 210 are connected in series, each of the two battery stacks 210 has a same even number of battery cells 220. The multiple battery cells 220 of each of the two battery stacks 210 are aligned in the longitudinal direction. The wire electrically connects the negative electrode terminal 222 of the battery cell 220 positioned at a right end in the longitudinal direction in one of the two battery stacks 210, with the positive electrode terminal 221 of the battery cell 220 positioned at a right end of the other of the two battery stacks 210. Thereby, the negative electrode terminal 222 of the battery cell 220 positioned at a left end in the longitudinal direction in one of the two battery stacks 210 has the lowest potential. The positive electrode terminal 221 of the battery cell 220 positioned at a left end of the other of the two battery stacks 210 has the highest potential. The positive electrode terminal 221 having the highest potential and the negative electrode terminal 222 having the lowest potential are arranged to be aligned in the lateral direction. The wiring portion 30 is placed on each of these two battery stacks 210.

(Other Modifications)

In the embodiment, it is exemplified that the battery pack 400 is applied to the hybrid vehicle. However, the battery pack 400 can also be applied to, for example, a plug-in hybrid vehicle and an electric vehicle.

In the present disclosure, a monitoring apparatus includes: a monitoring portion that monitors a voltage each of multiple battery cells connected in series, each of the battery cells having an electrode terminal; and a wiring portion that electrically connects the monitoring portion and the electrode terminal of the battery cell. The wiring portion includes a first flexible substrate and a second substrate that have flexibility and are integrally linked with each other. A linking part where the first flexible substrate and the second flexible substrate are linked is bent. The first flexible substrate is connected with the electrode terminal. The second flexible substrate is connected with the monitoring portion. One of the first flexible substrate and the second flexible substrate includes an arm. Another of the first flexible substrate and the second flexible substrate other than the one including the arm includes a slit. The arm is fixed to the slit, causing the linking part to be reinforced.

By fixing the arm to the slit, the linking part where the first flexible substrate in the bent state and the second flexible substrate are linked is reinforced. Thereby, the reinforcement may prevent occurrence of damage at the linking part even when, for example, expansion caused by heat of the first flexible substrate and the second flexible substrate causes the stress concentration at the linking part. As the result, it may be possible to prevent the deterioration of the lifetime of the wiring portion.

Further, the inventors found out the following.

When a current flows in the bus bar, a voltage drop occurs due to a resistance of the bus bar and the current flowing in the bus bar. As described above, the voltage detection line is connected with the bus bar. Accordingly, a voltage detected in the voltage detection line includes the voltage drop due to the resistance of the bus bar and the current flowing in the bus bar.

The voltage drops of the voltages detected in each of the multiple voltage detection lines may be equal when connection positions to the voltage detection line on the multiple bus bars are same for each of the multiple bus bars. However, variations of the voltage drops of the voltages detected in the multiple voltage detection lines occur when the connection positions with the voltage detection line on the multiple bus bars are different for the multiple bus bars. These variations of the voltage drops may cause variations of a detection accuracy of the voltage detected in the multiple voltage detection lines (wiring patterns).

Third Embodiment

FIGS. 18 to 27 describe a battery pack monitoring apparatus according to the embodiment. In the embodiment, an example that a battery pack is applied to a hybrid vehicle is described.

(Overview of Battery Pack)

A battery pack 1400 functions as power supply to an electric load of the hybrid vehicle. The electrical load includes a motor generator that functions as a power supply source and an electrical power source. For example, when the motor generator performs power running, the battery pack 1400 discharges to supply electric power to the motor generator. When the motor generator generates electricity, the battery pack 1400 charges a generated electric power caused by the electricity generation.

The battery pack 1400 includes a battery ECU 1300. The battery ECU 1300 is electrically connected with each kind of ECUs mounted on the hybrid vehicle (in-vehicle ECUs).

The battery ECU 1300 and the in-vehicle ECU mutually transmit or receive signals to perform a cooperation control to the hybrid vehicle. Due to the cooperation control, the electricity generation and the power running of the motor generator in accordance with a charge amount of the battery pack 1400, and an output of an internal combustion engine, or the like are controlled.

An ECU is an abbreviation of electronic control unit. The ECU includes at least one calculation process unit (also referred to as a CPU) and at least one memory device (also referred to as a MMR) as a storage medium storing a program and data. The ECU includes a microcontroller including a computer readable storage medium. The storage medium is a non-transitory tangible storage medium that non-temporarily stores a computer readable program. The storage medium may include a semiconductor memory, a magnetic disk, or the like.

The battery pack 1400 includes a battery module 1200. The battery module 1200 shown in FIG. 18 includes a battery stack 1210 in which multiple battery cells 1220 are electrically and mechanically connected in series.

The battery pack 1400 includes a monitoring apparatus 1100. The monitoring apparatus 1100 detects a voltage of each battery cell 1220 that configures the battery stack 1210. The monitoring apparatus 1100 outputs a monitoring result to the battery ECU 1300. The battery ECU 1300 determines equalization for SOCs of each of the multiple battery cells 1220, based on the monitoring result of the monitoring apparatus 1100. The battery ECU 1300 outputs an instruction of an equalization process based on the determination to the monitoring apparatus 1100. The monitoring apparatus 1100 executes the equalization process that equalizes the SOCs of the multiple battery cells 1220 in accordance with the instruction input from the battery ECU 1300. The SOC is an abbreviation of state of charge.

The battery pack 1400 includes the monitoring apparatus 1100, the battery module 1200, and the battery ECU 1300. In addition to the monitoring apparatus 1100, the battery module 1200, and the battery ECU 1300, the battery pack 1400 includes a blowing fan (not shown) cooling the battery module 1200. The battery ECU 1300 controls actuation of the blowing fan.

The battery pack 1400 is placed in, for example, an arrangement space under a seat of the hybrid vehicle. The arrangement space under a rear seat may be larger than the arrangement space under a front seat. Therefore, the battery pack 1400 in the embodiment may be placed in the arrangement space under the rear seat. However, a placement position of the battery pack 1400 is not limited to the arrangement space under the rear seat. The battery pack 1400 can be placed, for example, between the rear seat and a luggage room, between a driver seat or a front passenger seat, or the like.

The battery module 1200 and the monitoring apparatus 1100 will be described. Three directions orthogonal to each other may be referred to as a lateral direction, a longitudinal direction, and a height direction. In the embodiment, the lateral direction is along an advancing/retreating direction of the hybrid vehicle. The longitudinal direction is along a right/left direction of the hybrid vehicle. The height direction is along a vertical direction of the hybrid vehicle. Incidentally, three directions orthogonal to each other may be referred to as a first direction, a second direction, a third direction.

(Overview of Battery Module)

The battery module 1200 includes the battery stack 1210. The battery module 1200 includes a battery case (not shown) that accommodates the battery stack 1210. The battery case has a housing and a lid. The housing is produced by aluminum die casting. The housing can be also produced by press working of iron or stainless steel. The lid is formed by a resin material or a metal material.

The housing has a box shape which opens in the height direction and also includes a bottom. An opening of the housing is covered with lid. The housing and the lid include an accommodation space that accommodates the battery stack 1210 and the monitoring apparatus 1100. The accommodation space includes a flowing path where winds flow. At least one of the housing or the lid includes a communication hole for communicating the external atmosphere with the flow channel.

The battery stack 1210 includes multiple battery cells 1220. These multiple battery cells 1220 are aligned in the longitudinal direction. The multiple battery cells 1220 are electrically and mechanically connected in series. Therefore, an output voltage of the battery module 1200 is obtained by summing the output voltages of the multiple battery cells 1220. The number of battery cells 1220 held by the battery stack 1210 is three or more. The longitudinal direction corresponds to a first direction.

(Overview of Monitoring Apparatus)

Figure 17:
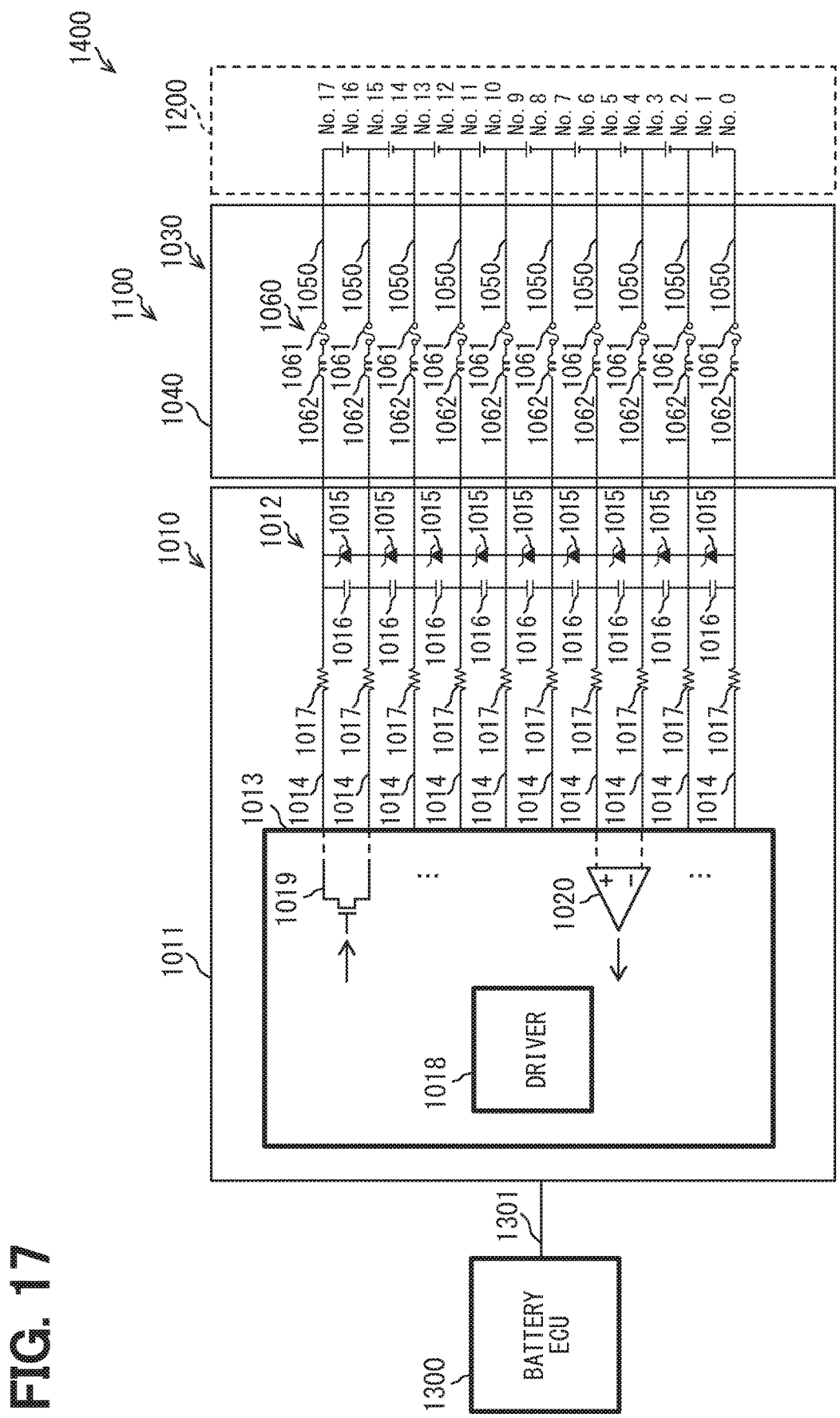
FIG. 17 is a circuit diagram of a battery pack.

As shown in FIG. 17, the monitoring apparatus 1100 includes a monitoring portion 1010 that monitors the voltage of each of the multiple battery cells 1220, and a wiring portion 1030 that electrically connects the monitoring portion 1010 with each of the multiple battery cells 1220.

The monitoring portion 1010 is placed with the battery module 1200 in such a mode that the monitoring portion 1010 is aligned in parallel with the battery stack 1210 in the longitudinal direction or the height direction. The wiring portion 1030 is placed with the battery module 1200 in such a mode that the monitoring portion 1010 is aligned with the battery stack 1210 in the height direction.

(Configuration of Battery Stack)

Figure 18:
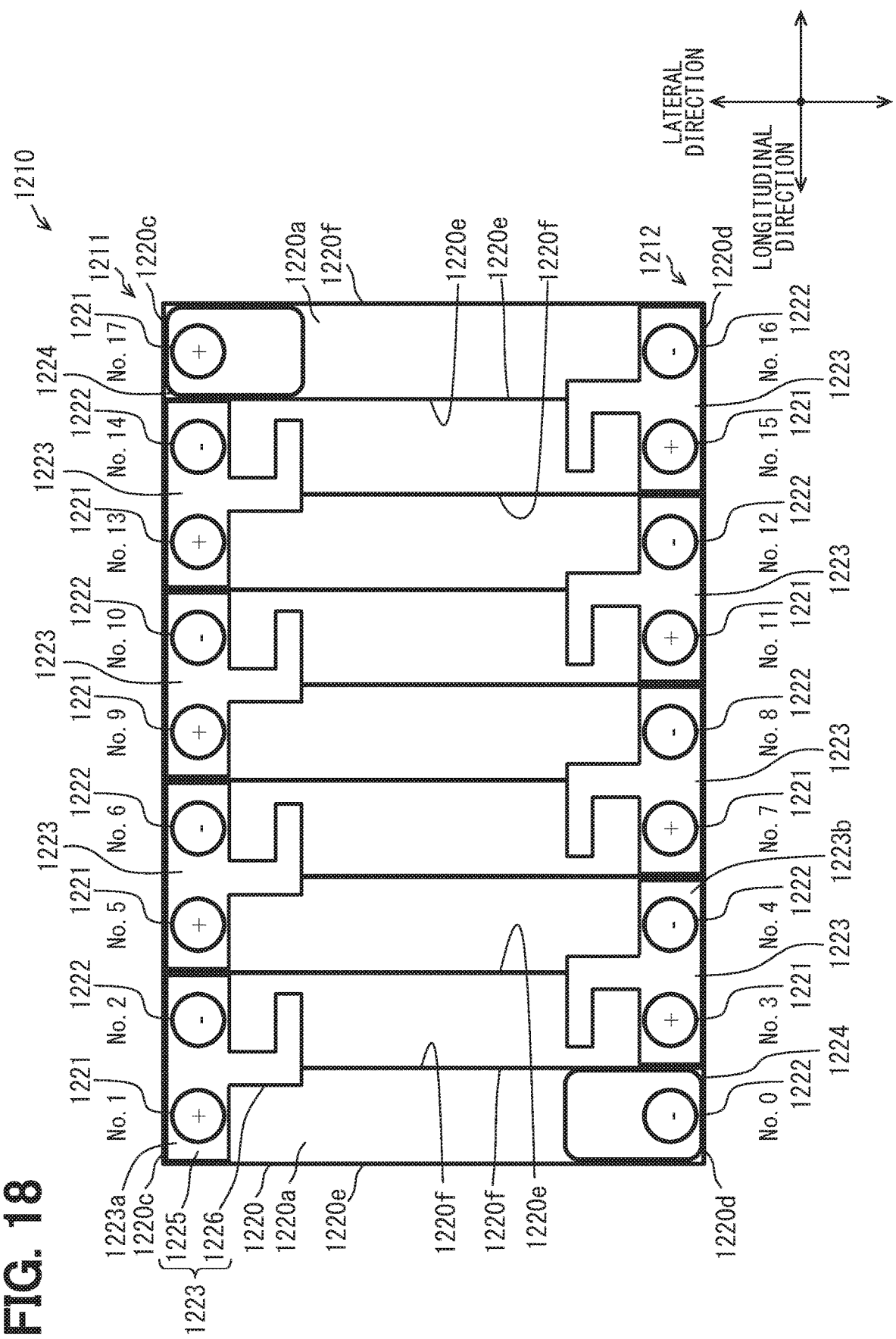
FIG. 18 is a top view illustrating a battery stack.

The battery stack 1210 includes multiple battery cells 1220. As shown in FIG. 18, the battery cell 1220 has a quadrangular prism shape. The battery cell 1220 has six surfaces.

The battery cell 1220 includes an upper end surface 1220a facing in the height direction. The battery cell 1220 has a lower end surface that faces in the height direction and is aligned apart from the upper end surface 1220a in the height direction (not shown). The battery cell 1220 includes a first side surface 1220c and a second side surface 1220d that face in the lateral direction. The battery cell 1220 includes a first main surface 1220e and a second main surface 1220f that face in the longitudinal direction. Among these six surfaces, the first main surface 1220e and the second main surface 1220f have larger areas than the other four surfaces.

In the battery cell 1220, a length in the longitudinal direction is shorter than a length in the height direction and a length in the lateral direction. Therefore, the battery cell 1220 has a flat plate shape with a short longitudinal length. The multiple battery cells 1220 are aligned in the longitudinal direction.

The battery cell 1220 corresponds to a secondary battery. Specifically, the battery cell 1220 corresponds to a lithium ion secondary battery. The lithium ion secondary battery generates an electromotive voltage by a chemical reaction. A generation of the electromotive voltage causes a current to flow in the battery cell 1220. Thereby, a gas occurs in the battery cell 1220. The battery cell 1220 may expand. The battery cell 1220 is not limited to the lithium ion secondary battery. As the battery cell 1220, for example, a nickel hydrogen secondary battery, an organic radical battery, or the like can be employed.

The first main surface 1220e and the second main surface 1220f of the battery cell 1220 have larger areas than the other four surfaces. Therefore, in the battery cell 1220, the first main surface 1220e and the second main surface 1220f may easily expand. Thereby, the battery cell 1220 may expand in the longitudinal direction. That is, the battery cell 1220 may expand in a direction aligned with the multiple battery cells 1220.

The battery stack 1210 includes a restraint (not shown). The restraint mechanically connects, in series, the multiple battery cells 1220 in the longitudinal direction. The restraint prevents an increase in a size of the battery stack 1210, the increase being caused by the each expansion of the multiple battery cells 1220.

An insulation separator is placed between battery cells 1220 adjacent to each other. Thereby, a gap is provided between the battery cells 1220 adjacent to each other. Air passes through the gap, and heat dissipation of each battery cell 1220 is promoted.

A positive electrode terminal 1221 and a negative electrode terminal 1222 are formed on the upper end surface 1220a of the battery cell 1220. The positive electrode terminal 1221 and the negative electrode terminal 1222 are aligned apart from each other in the lateral direction. The positive electrode terminal 1221 is positioned toward the first side surface 1220c. The negative electrode terminal 1222 is positioned toward the second side surface 1220d.

As shown in FIG. 18, between the two battery cells 1220 aligned adjacent to each other, each of first main surfaces 1220e faces each other, and each of the second main surface 1220f faces each other. The upper end surfaces 1220a of the two battery cells 1220 aligned adjacent to each other are aligned in the longitudinal direction. Thereby, in the two battery cells 1220 aligned adjacent to each other, the positive electrode terminal 1221 of one battery cell 1220 and the negative electrode terminal 1222 of the other battery cell 1220 are aligned in the longitudinal direction. As the result, in the battery stack 1210, the positive electrode terminal 1221 and the negative electrode terminal 1222 are alternately aligned in the longitudinal direction.

The battery stack 1210 includes a first electrode terminal group 1211 where the negative electrode terminal 1222 and the positive electrode terminal 1221 are alternately aligned in the longitudinal direction, and a second electrode terminal group 1212 where the positive electrode terminal 1221 and the negative electrode terminal 1222 are alternately aligned in the longitudinal direction. The positive electrode terminal 1221 and the negative electrode terminal 1222 in the first electrode terminal group 1211 are aligned in a reversed order of the second electrode terminal group 1212. The first electrode terminal group 1211 and The second electrode terminal group 1212 are aligned apart from each other in the lateral direction.

Among the electrode terminals configuring the first electrode terminal group 1211 and the second electrode terminal group 1212, one positive electrode terminal 1221 and one negative electrode terminal 1222 are adjacent to each other in the vertical direction, and are mechanically and electrically connected by a series terminal 1223. Thereby, the multiple battery cells 1220 configuring the battery stack 1210 are electrically connected in series. The series terminal 1223 will be described.

The battery stack 1210 in the embodiment includes nine battery cells 1220. These nine battery cells 1220 are connected in series. Therefore, a total number of the positive electrode terminal 1221 and the negative electrode terminal 1222 is eighteen. As shown in FIG. 17 and FIG. 18, number symbol (No) increasing in number from the lowest potential to the highest potential are applied to these eighteen electrode terminals.

As shown in FIG. 18, the positive electrode terminal 1221 of No. 1 and the negative electrode terminal 1222 of No. 2 are aligned adjacent to each other in the longitudinal direction. The positive electrode terminal 1221 and the negative electrode terminal 1222 aligned adjacent to each other in the lateral direction are connected by the series terminal 1223.

Similarly, in the first electrode terminal group 1211, the electrode terminals of No. 1 and No. 2, the electrode terminals of No. 5 and No. 6, the electrode terminals No. 9 and No. 10, and the electrode terminals No. 13 and No. 14 are connected by the series terminals 1223. In the second electrode terminal group 1212, the electrode terminals of No. 3 and No. 4, the electrode terminals of No. 7 and No. 8, the electrode terminals No. 11 and No. 12, and the electrode terminals No. 15 and No. 16 are connected by the series terminals 1223. The nine battery cells 1220 are connected in series by the total of eight series terminals 1223.

In the connection configuration, the negative electrode terminal 1222 of No. 0 has the lowest potential. The negative electrode terminal 1222 of No. 0 has the ground potential. The positive electrode terminal 1221 of No. 17 has the highest potential. The positive electrode terminal 1221 of No. 17 has a potential obtained by summing outputs of each of the battery cells 1220.

The negative electrode terminal 1222 having the lowest potential and the positive electrode terminal 1221 having the highest potential are connected with the output terminal 1224. These two output terminals 1224 are electrically connected with an electrical load. As the result, a potential difference between the lowest potential and the highest potential is output to the electrical load as the output voltage of the battery module 1200.

(Circuit Configuration of Monitoring Apparatus)

A circuit configuration of the monitoring apparatus 1100 will be described with reference to FIG. 17 and FIG. 20.

As shown in FIG. 17, the monitoring portion 1010 includes a wiring substrate 1011, a first electronic element 1012, and a monitoring IC chip 1013. The first electronic element 1012 and the monitoring IC chip 1013 are mounted on the wiring substrate 1011. The first electronic element 1012 and the monitoring IC chip 1013 are electrically connected by a substrate wiring 1014 of the wiring substrate 1011.

The wiring portion 1030 is connected with the wiring substrate 1011. The wiring portion 1030 is connected with the battery stack 1210. Thereby, the monitoring portion 1010 is electrically connected with the battery stack 1210 by the wiring portion 1030.

A connector (not shown) is placed on the wiring substrate 1011. A wire 1301 shown in FIG. 17 is connected with the connector. The monitoring portion 1010 and the battery ECU 1300 are electrically connected by the wire 1301.

The wiring portion 1030 includes a front wiring portion 1031 and a back wiring portion 1032. Each of the front wiring portion 1031 and the back wiring portion 1032 includes a flexible substrate 1033 having flexibility, and multiple wiring patterns 1034 formed on the flexible substrate 1033.

The multiple wiring patterns 1034 are connected with the series terminal 1223 and the output terminal 1224. The multiple substrate wirings 14 in accordance with each of the multiple wiring patterns 1034 are formed on the wiring substrate 1011. These multiple wiring patterns 1034 and the multiple substrate wirings 14 are electrically connected.

In the following, in order to simplify the description, the wiring pattern 1034 and the substrate wiring 1014 electrically connected with each other may be collectively referred to as a voltage detection line.

As shown in FIG. 17, a second electronic element 60 is mounted on the flexible substrate 1033. The second electronic element 60 includes a fuse 1061 and an inductor 1062. The monitoring portion 1010 includes, as the first electronic element 1012, a Zener diode 1015, a parallel capacitor 16, and a resistor 1017. Each of the Zener diode 1015, the parallel capacitor 16, and the resistor 1017 is mounted on the wiring substrate 1011.

As shown in FIG. 17, the fuse 1061, the inductor 1062, and the resistor 1017 are placed in each of the multiple voltage detection lines. The fuse 1061, the inductor 1062, and the resistor 1017 are connected in series in order from the battery cell 1220 to the monitoring IC chip 1013.

Each of the Zener diode 1015 and the parallel capacitor 16 is connected in parallel between the two voltage detection lines aligned in order of potential. Specifically, the Zener diode 1015 and the parallel capacitor 16 are connected between the inductor 1062 and the resistor 1017 in the voltage detection line. An anode electrode of the Zener diode 1015 is connected with the lower potential side of the two adjacent voltage detection lines. A cathode electrode of the Zener diode 1015 is connected with the high potential side of the two adjacent voltage detection lines.

In the connection configuration, the resistor 1017 and the parallel capacitor 16 configure a RC circuit. The RC circuit and the inductor 1062 function as a filter reducing noise at a time of the voltage detection.

The Zener diode 1015 has a structure in which a short failure occurs when an overvoltage is applied from the battery module 1200. Specifically, the Zener diode 1015 has a structure in which a PN junction type IC chip is directly sandwiched by a pair of leads. Thereby, for example, unlike a configuration where the IC chip and the lead are indirectly connected by the wire, the Zener diode 1015 may be possible to avoid an open failure caused by a breakage of the wire due to application of overvoltage.

The fuse 1061 is broken due to a large current flowing in the voltage detection line when the overvoltage causes a short fault of the Zener diode 1015 occurs. The rated current of the fuse 1061 is set to a standard of the large current flowing in the voltage detection line when the overvoltage causes the short failure of the Zener diode 1015. The breakage of the fuse 1061 prevents the flow of the large current into the monitoring IC chip 1013.

As shown in FIG. 17, the monitoring IC chip 1013 includes a driver 1018 that executes a signal process such as amplification, and a switch 1019 in accordance with each of the multiple battery cells 1220. The switch 1019 controls an electrical connection between two voltage detection lines aligned in order of potential. One end of the switch 1019 is connected with the wiring of the monitoring IC chip 1013 connected with one of the two voltage detection lines aligned in order of potential. The other end of the switch 1019 is connected with the wiring of the monitoring IC chip 1013 connected with the other of the two voltage detection lines aligned in order of potential. The switching control of the switch 1019 controls charging/discharging of the battery cell 1220 electrically connected with the two voltage detection lines connected with the switch 1019.

The monitoring IC chip 1013 includes a comparator 1020 that detects each of the voltages of the multiple battery cells 1220. The two voltage detection lines aligned in order of potential are connected with an inversion input terminal and a non-inversion input terminal of the comparator 1020. Thereby, the positive electrode terminal 1221 and the negative electrode terminal 1222 of one battery cell 1220 are connected with the inversion input terminal and the non-inversion input terminal of the comparator 1020. The output terminal of the comparator 1020 is connected with the wiring of the monitoring IC chip 1013. The battery ECU 1300 receives the output voltage of the comparator 1020 as a differentially amplified output voltage (an electromotive voltage) of one battery cell 1220.

An input impedance of the comparator 1020 is higher than an output impedance of the comparator 1020. Therefore, an amount of a current flowing from the battery cell 1220 to the comparator 1020 is small. The current flowing from the battery cell 1220 to the comparator 1020 is smaller than the current flowing to the battery stack 1210 of the multiple battery cells 1220 connected in series. The comparator 1020 corresponds to a voltage detection circuit.

There is a correlation between the state of charge (SOC) and the electromotive voltage of the battery cell 1220. The battery ECU 1300 stores the correlation. The battery ECU 1300 detects the SOC of each of the multiple battery cells 1220 based on the stored correlation and the output voltage (electromotive voltage) input from the monitoring IC chip 1013.

The battery ECU 1300 determines the equalization process of the SOCs of the multiple battery cells 1220, based on the detected result. The battery ECU 1300 outputs the instruction of the equalization process based on the determination to the driver 1018 of the monitoring IC chip 1013. The driver 1018 follows the instruction of the equalization process to perform the switching control of the switch 1019 in accordance with each of the multiple battery cells 1220. Thereby, the multiple battery cells 1220 charge and discharge. The SOCs of the multiple battery cells 1220 are equalized.

The battery ECU 1300 detects a charge state of the battery stack 1210 based on the input voltage or the like. The battery ECU 1300 outputs the detected charge state of the battery stack 1210 to the in-vehicle ECU. The in-vehicle ECU outputs an instruction signal to the battery ECU 1300 based on the charge state, vehicle information such as a depression amount of an accelerator pedal, a throttle valve opening that are input from the various sensors mounted on the vehicle, an ignition switch, or the like. The battery ECU 1300 controls the connection between the battery stack 1210 and the electrical load based on the instruction signal.

A system main relay (not shown) is placed between the battery stack 1210 and the electrical load. The system main relay controls the electrical connection between the battery stack 1210 and the electrical load by generation of a magnetic field. The battery ECU 1300 controls the connection between the battery stack 1210 and the electrical load by controlling the generation of the magnetic field of the system main relay.

(Configuration of Wiring Portion)

The configuration of the wiring portion 1030 will be described with reference to FIG. 19 to FIG. 21. The wiring portion 1030 includes the front wiring portion 1031 and the back wiring portion 1032. Each of the front wiring portion 1031 and the back wiring portion 1032 includes the flexible substrate 1033 and the multiple wiring patterns 1034.

Figure 19:
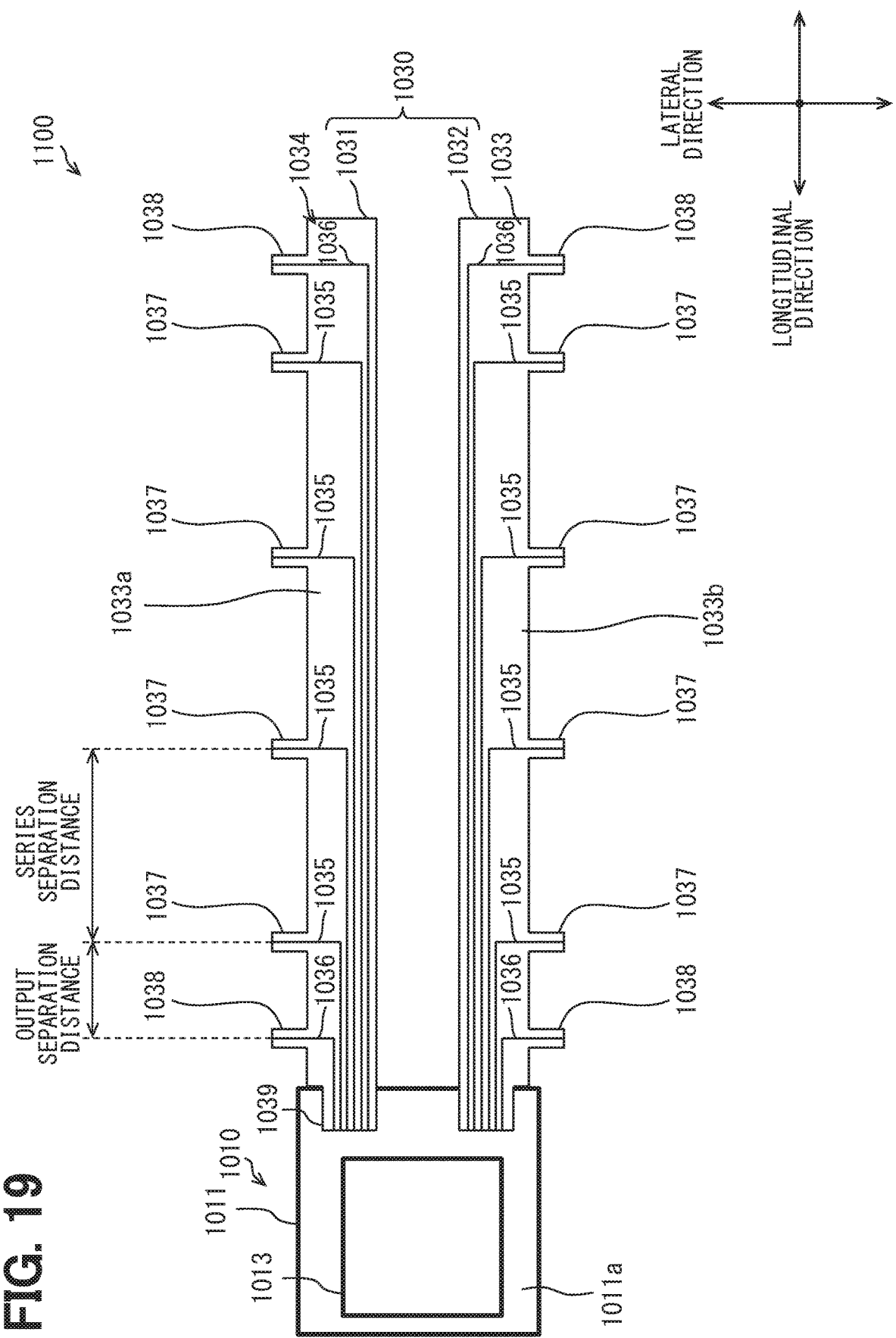
FIG. 19 is a top view of a monitoring apparatus.

As shown in FIG. 19, the flexible substrate 1033 has a rectangular shape extending in the longitudinal direction. A length in the longitudinal direction of the flexible substrate 1033 is determined in accordance with a length in the longitudinal direction of the battery stack 1210.

The flexible substrate 1033 is thinner than the wiring substrate 1011 and made of a flexible resin material. Therefore, the flexible substrate 1033 can be bent. That is, the flexible substrate 1033 is elastically deformable. The flexible substrate 1033 corresponds to a flexible substrate.

As shown in the drawings, a part of the flexible substrate 1033 has a notch or a bellows structure so as to largely deform in the longitudinal direction and the lateral direction. The flexible substrate 1033 may have the notch or a hole which penetrates in the height direction in order to avoid prevention of a wind flow in the accommodation space formed by the battery case.

The wiring pattern 1034 is formed on a front surface 1033a of the flexible substrate 1033. A coating resin covers the wiring pattern 1034. A tip toward an end of the wiring pattern 1034 is protruded toward the outside of each of the flexible substrate 1033 and the coating resin to be exposed. The tip toward one end of the wiring pattern 1034 is mechanically and electrically connected with the series terminal 1223 and the output terminal 1224 by welding or the like. A tip toward the other end of the wiring pattern 1034 is mechanically and electrically connected with the substrate wiring 1014 of the wiring substrate 1011 by solder or the like. The drawings illustrate that the tip toward the end of the wiring pattern 1034 is placed on the flexible substrate 1033 in order to simplify the description.

The front wiring portion 1031 and the back wiring portion 1032 have the same configuration. Accordingly, the flexible substrate 1033 and the wiring pattern 1034 of the front wiring portion 1031, and the flexible substrate 1033 and the wiring pattern 1034 of the back wiring portion 1032 have the same shape. The front wiring portion 1031 corresponds to a first wiring portion. The back wiring portion 1032 corresponds to a second wiring portion.

(Mounting Mode of Front Wiring Portion and Back Wiring Portion)

The front wiring portion 1031 and the back wiring portion 1032 have the same configuration. However, the front wiring portion 1031 and the back wiring portion 1032 are different in the mounting mode on the battery stack 1210. As shown in FIG. 20, the front wiring portion 1031 is mounted on the battery stack 1210 in such a mode that a back surface 1033b of the flexible substrate 1033 faces the upper end surface 1220a of the battery cell 1220. The back wiring portion 1032 is mounted on the battery stack 1210 in such a mode that the front surface 1033a of the flexible substrate 1033 faces the upper end surface 1220a. Front/back of the front wiring portion 1031 and the back wiring portion 1032 are reversed to each other, and are mounted on the battery stack 1210. Therefore, in the front wiring portion 1031 and the back wiring portion 1032, front/back of each arrangement of the wiring patterns 1034 are reversed to each other. For example, when the arrangement for the front wiring pattern 1031 is reversed, the reversed arrangement corresponds to an arrangement for the back wiring portion 1032.

The tip toward the end of the wiring pattern 1034 is exposed from each of the flexible substrate 1033 and the coating resin. Accordingly, even when the front/back of the flexible substrate 1033 is reversed, the flexible substrate 1033 or the covering resin is not positioned between the tip toward the one end of the wiring pattern 1034 and the series terminal 1223 or the output terminal 1224. The flexible substrate 1033 or the covering resin is not positioned between the tip toward the other end of the wiring pattern 1034 and the wiring substrate 1011.

The front wiring portion 1031 and the back wiring portion 1032 are placed between the first electrode terminal group 1211 and the second electrode terminal group 1212 on the upper end surface 1220a of the multiple battery cells 1220. The front wiring portion 1031 and the back wiring portion 1032 are apart from each other in the lateral direction. The front wiring portion 1031 is positioned toward the first electrode terminal group 1211. The back wiring portion 1032 is positioned toward the second electrode terminal group 1212.

The wiring pattern 1034 of the front wiring portion 1031 is connected with the series terminal 1223 and the output terminal 1224 which are electrically and mechanically connected with the electrode terminals configuring the first electrode terminal group 1211. The wiring pattern 1034 of the back wiring portion 1032 is connected with the series terminal 1223 and the output terminal 1224 which are electrically and mechanically connected with the electrode terminals configuring the second electrode terminal group 1212.

As described above, the wiring portion 1030 and the battery stack 1210 have an electrical connection configuration shown in FIG. 17. The wiring portion 1030 can detect voltages of all the battery cells 1220 configuring the battery stack 1210.

(Connection Configuration)

The connection configuration of the wiring pattern 1034 will be described with reference to FIG. 19 and FIG. 20. The connection configuration connects the series terminal 1223 and the output terminal 1224 with the wiring substrate 1011.

The wiring pattern 1034 includes multiple first wirings 1035 connected with the series terminal 1223 and multiple second wirings 36 connected with the positive electrode terminal 1221 and the negative electrode terminal 1222 of the two battery cells 1220 which are positioned on both ends of the multiple battery cells 1220 aligned in the longitudinal direction. In the embodiment, specifically, the second wiring 1036 is connected with the output terminal 1224. The first wiring 1035 corresponds to a serial wiring pattern. The second wiring 1036 corresponds to a both end wiring pattern.

Figure 20:
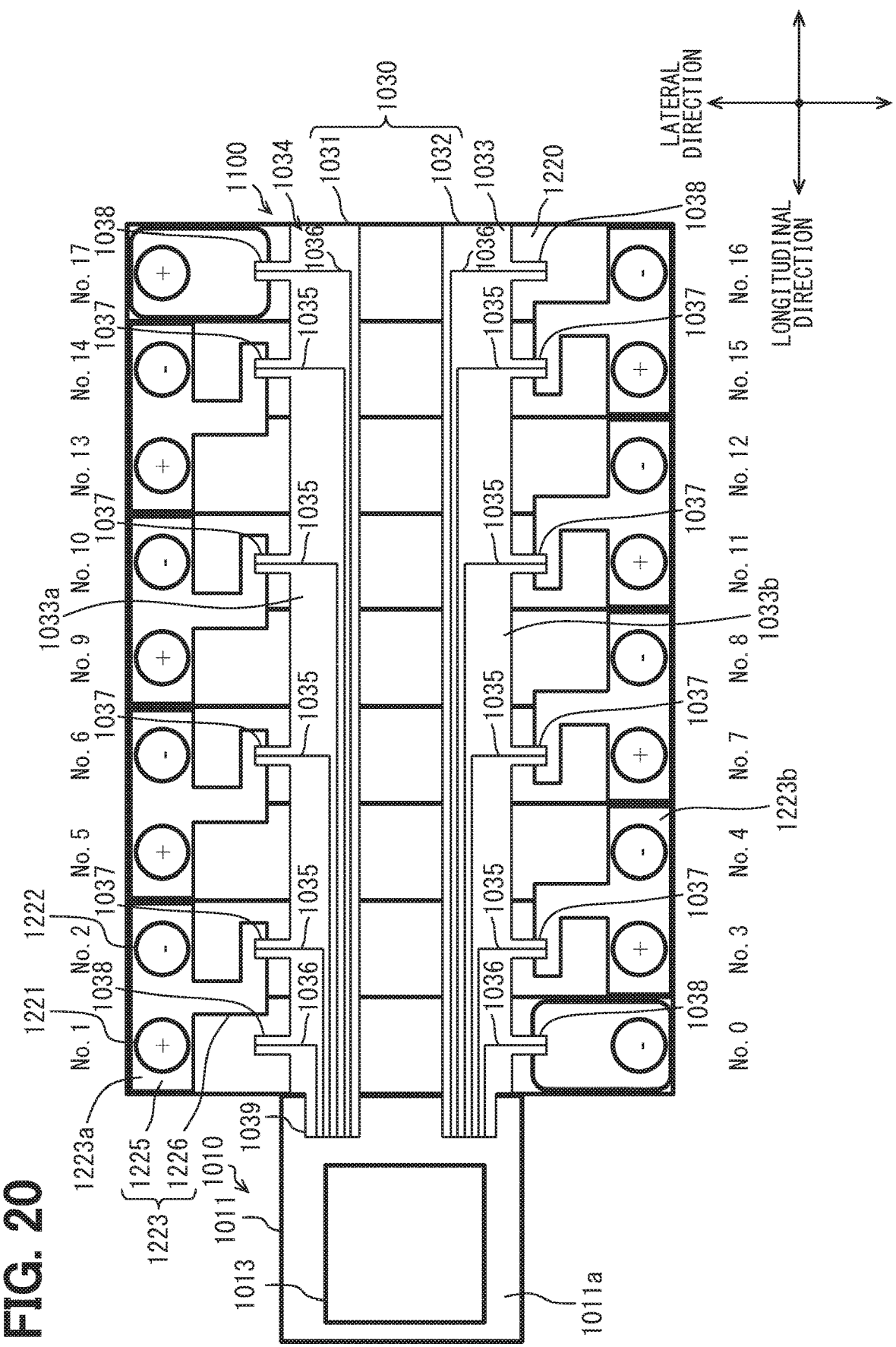
FIG. 20 is a top view illustrating a state where the monitoring apparatus is placed on the battery stack.
Figure 21:
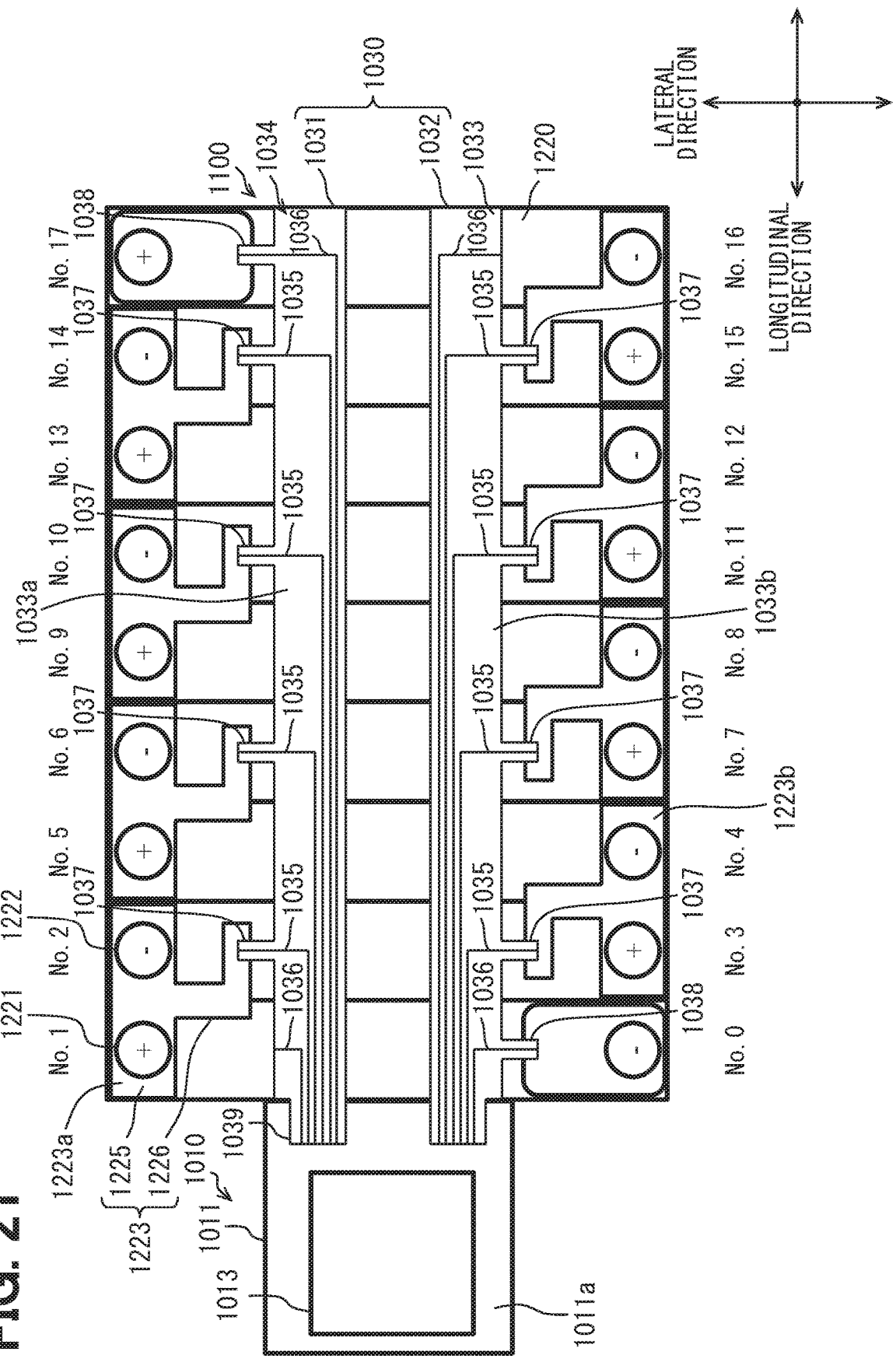
FIG. 21 is a top view illustrating the monitoring apparatus in a state where an unnecessary second protrusion is removed.

As shown in FIG. 20, the multiple first wirings 1035 are positioned between the two second wirings 36. Each of one ends of the multiple first wirings 1035 and the two second wirings 36 extends toward the electrode terminal group. Each of the other ends of the multiple first wirings 1035 and the two second wirings 36 extends toward the wiring substrate 1011. The one end of the first wiring 1035 is connected with the series terminal 1223. The one end of the second wiring 1036 is connected with the output terminal 1224. Each of the other ends of the first wiring 1035 and the second wiring 1036 is connected with the wiring substrate 1011.

The flexible substrate 1033 includes multiple first protrusions 1037 and two second protrusions 1038 which extend toward the electrode terminal group. The one end of the first wiring 1035 is placed on the first protrusion 1037. The one end of the second wiring 1036 is placed on the second protrusion 1038. The tip toward one end of the first wiring 1035 is exposed from the first protrusion 1037. The tip toward the one end of the second wiring 1036 is exposed from the second protrusion 1038.

The two second protrusions 1038 are aligned apart from each other in the longitudinal direction. The multiple first protrusions 1037 are positioned between the two second protrusions 1038. The multiple first protrusions 1037 are also aligned apart from each other in the longitudinal direction.

Due to the longitudinal alignment of the protrusions, the first protrusion 1037 positioned at the end of the multiple first protrusions 1037 aligned in the longitudinal direction and one second protrusion 1038 are aligned adjacent to each other in the longitudinal direction. The two adjacent battery cells 1220 aligned in the longitudinal direction include the electrode terminals having a different pole. A separation distance in the longitudinal direction between these first protrusions 1037 and these second protrusions 1038 is equal to a separation distances between the electrode terminals having the different pole. That is, the separation distances in the longitudinal direction between the first protrusions 1037 and the second protrusions 1038 is equal to the separation distance between the positive electrode terminal 1221 of one of the two adjacent battery cells 1220 aligned in the longitudinal direction and the negative electrode terminal 1222 of the other of the two adjacent battery cells 1220.

The two battery cells 1220 sandwich one battery cell 1220, are aligned in the longitudinal direction, and include the electrode terminals having the same pole. A separation distance between the two first protrusions 1037 aligned adjacent to each other in the longitudinal direction is equal to a separation distance between the electrode terminals having the same pole. That is, the separation distance between the two adjacent first protrusions 1037 aligned in the longitudinal direction is equal to the separation distance between a positive electrode terminal 1221 of one of the two adjacent battery cells 1220 that sandwich one battery cell 1220 and are aligned in the longitudinal direction and a positive electrode terminal 1221 of the other of the two adjacent battery cells 1220. In other words, the separation distance between the two adjacent first protrusions 1037 aligned in the longitudinal direction is equal to the separation distance between the negative electrode terminal 1222 of one of the two adjacent battery cells 1220 that sandwich one battery cell 1220 and are aligned in the longitudinal direction and the negative electrode terminal 1222 of the other of the two adjacent battery cells 1220.

In the following, the separation distance in the longitudinal direction between the first protrusion 1037 and the second protrusion 1038 aligned adjacent to each other in the longitudinal direction may be referred to as an output separation distance, in order to avoid complication of the description. The longitudinal direction separation distance between the two adjacent first protrusions 1037 aligned in the longitudinal direction may be referred to as a series separation distance. Generally, the output separation distance is about half of the series separation distance. The output separation distance is about the longitudinal length of one battery cell 1220. The series separation distance is about a longitudinal length between the two adjacent battery cells 1220 aligned in the longitudinal direction.

As shown in FIG. 20, one of the two second protrusions 1038 of the front wiring portion 1031 is connected with the output terminal 1224 connected with the positive electrode terminal 1221 of No. 17 in the first electrode terminal group 1211. However, the remaining one of the two second protrusions 1038 of the front wiring portion 1031 is connected with nothing. The second protrusion 1038 which does not contribute to such connection can be omitted, for example, as shown in FIG. 21.

Similarly, one of the two second protrusions 1038 of the back wiring portion 1032 is connected with the output terminal 1224 connected with the negative electrode terminal 1222 of No. 0 in the second electrode terminal group 1212. However, the remaining one of the two second protrusions 1038 of the back wiring portion 1032 is connected with nothing. The second protrusion 1038 which does not contribute to such connection can be omitted in the similar way.

The front wiring portion 1031 and the back wiring portion 1032 include one extra second protrusion 1038 which does not contribute to the connection. Each of the front wiring portion 1031 and the back wiring portion 1032 holds one such extra second protrusion 1038 since one of the front wiring portion 1031 and the back wiring portion 1032 is connected with one of the two output terminals 1224 separated in the longitudinal direction. The other of the front wiring portion 1031 and the back wiring portion 1032 is connected with the other of the two output terminals separated in the longitudinal direction.

However, the front wiring portion 1031 and the back wiring portion 1032 include one extra second protrusion 1038 that does not contribute to the connection since the number of the three or more battery cells 1220 of the battery stack 1210 is an odd number. When the number of the three or more battery cells 1220 of the battery stack 1210 is the even number, the two second protrusions 1038 of the front wiring portion 1031 do not contribute to the connection. The two second protrusions 1038 held by the back wiring portion 1032 contribute to the connection. The front wiring portion 1031 and the back wiring portion 1032 can be connected with the two output terminals 1224 regardless of whether the number of three or more battery cells 1220 of the battery stack 1210 is the odd number or the even number.

The flexible substrate 1033 includes a projection portion 1039 extending toward the monitoring portion 1010. The other end of the wiring pattern 1034 is placed on the projection portion 1039. The tip the other end of the wiring pattern 1034 is exposed to the outside of the projection portion 1039. The tip toward the other end of the wiring pattern 1034 is connected with the substrate wiring 1014 formed on a front surface 11$a$ of the wiring substrate 1011. Together with this, the projection portion 1039 is linked with the front surface 11$a$ of the wiring substrate 1011.

The tip toward the other end of the wiring pattern 1034 and the projection portion 1039 may be linked with a back surface that is a backside of the front surface 11$a$ of the wiring substrate 1011. Furthermore, the tip toward the other end of the wiring pattern 1034 of the front wiring portion 1031 and the projection portion 1039 may be connected with one of the front surface 11$a$ or the back surface of the wiring substrate 1011. Furthermore, the tip toward the other end of the wiring pattern 1034 of the back wiring portion 1032 and the projection portion 1039 may be connected with the other of the front surface 11$a$ or the back surface of the wiring substrate 1011.

It may be possible to employ a configuration in which the tip toward the other end of the wiring pattern 1034 is not exposed to the outside of the projection portion 1039. In the case, a via for electrically connecting the other end of the wiring pattern 1034 with the substrate wiring 1014 is formed in the projection portion 1039. The via functions to electrically connect the front surface 1033$a$ with the back surface 1033$b$ of the flexible substrate 1033 configuring the projection portion 1039. The via is electrically connected with the substrate wiring 1014. Thereby, a wiring pattern 1034 and the substrate wiring 1014 are electrically connected by the via.

(Configuration of Series Terminal)

A configuration of the series terminal 1223 will be described with reference to FIG. 18 and FIG. 22.

The series terminal 1223 has a thin flat shape in the height direction. The series terminal 1223 has a first connection surface 1223a and a second connection surface 1223b facing in the height direction. The series terminal 1223 connected with the electrode terminals configuring the first electrode terminal group 1211 and the series terminal 1223 connected with the electrode terminals configuring the second electrode terminal group 1212 have the same configuration. However, the two series terminals 1223 have different connection modes with the battery stack 1210.

As shown in FIG. 18, the series terminals 1223 connected with the electrode terminals configuring the first electrode terminal group 1211 are connected with the battery stack 1210 in such a mode that the second connection surface 1223b faces the upper end surface 1220a. The series terminals 1223 connected with the electrode terminals configuring the second electrode terminal group 1212 are connected with the battery stack 1210 in such a mode that the first connection surface 1223a faces the upper end surface 1220a. The series terminal 1223 connected with the electrode terminal configuring the first electrode terminal group 1211 and the series terminal 1223 connected with the electrode terminal configuring the second electrode terminal group 1212 have reversed connection surfaces to the battery stack 1210. In other words, a connection surface for the first electrode terminal group 1211 on the battery stack 1210 is opposed to a connection surface for the second electrode terminal group 1212 on the battery stack 1210.

Figure 22:
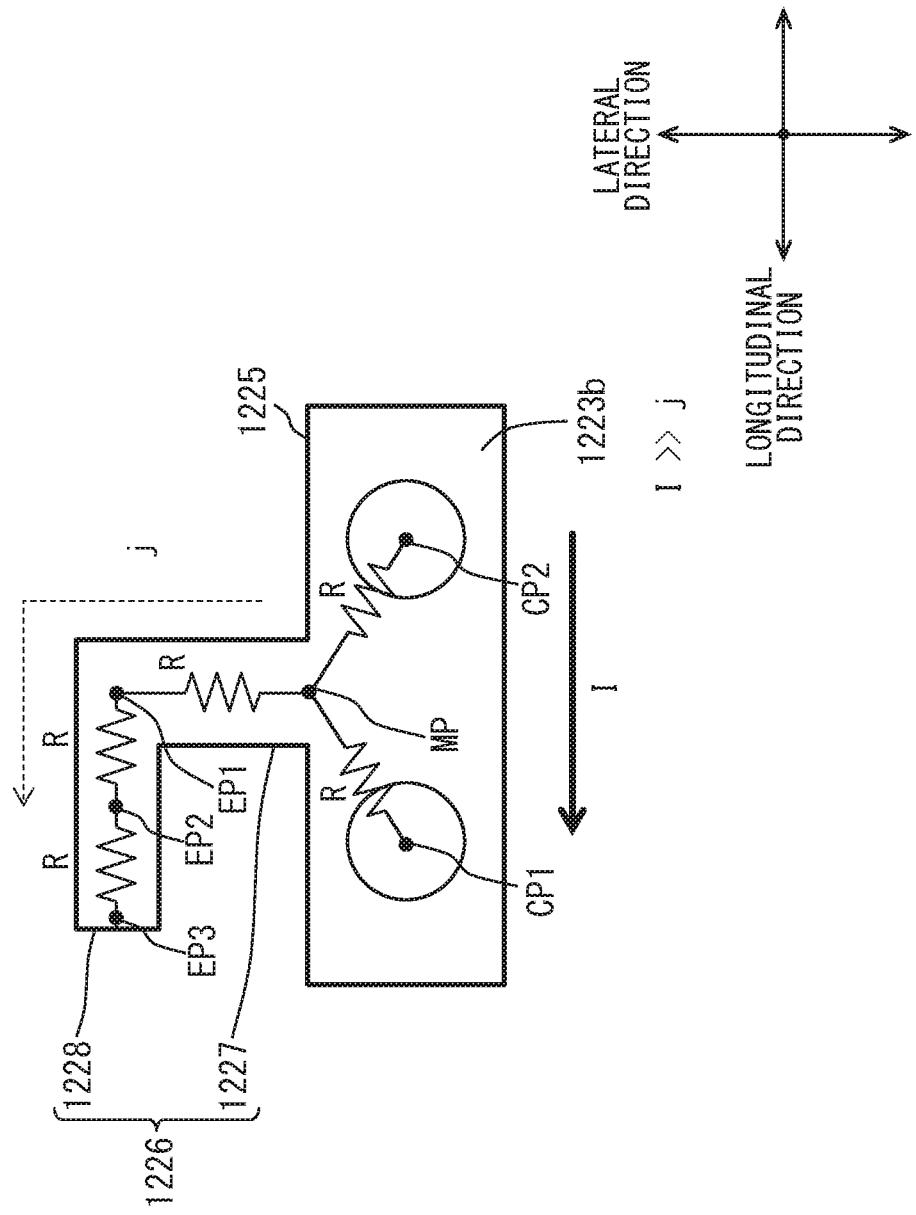
FIG. 22 is a top view describing a series terminal.

As shown in FIG. 22, the series terminal 1223 includes a link portion 1225 and a connection portion 1226 which are integrally linked. The link portion 1225 connects the positive electrode terminal 1221 and the negative electrode terminal 1222. The connection portion 1226 is connected with the tip toward the one end of the first wiring 1035 protruding from the first protrusion 1037. Therefore, the connection portion 1226 is connected with an input terminal of the comparator 1020 having a high input impedance by the first wiring 1035, the substrate wiring 1014, and the wiring of the monitoring IC chip 1013.

Due to the connection configuration, a current flows in the link portion 1225, the current flowing in the battery stack 1210 connected with the multiple battery cells 1220 in series. A small amount of current flows in the connection portion 1226 as compared to the current flowing in the link portion 1225. Hereinafter, the current flowing in the link portion 1225 may be referred to as a main current l in order to simplify the description. The current flowing in the connection portion 1226 may be referred to as a detection current j.

The link portion 1225 has a rectangular shape extending in the longitudinal direction. A length in the longitudinal direction of the link portion 1225 is the series separation distance described above. The positive electrode terminal 1221 is connected with one of both ends in the longitudinal direction of the link portion 1225. The negative electrode terminal 1222 is connected with the other of the both ends in the longitudinal direction of the link portion 1225.

In FIG. 22, in order to clarify a connection position of each of the positive electrode terminal 1221 and the negative electrode terminal 1222 in the link portion 1225, the positive electrode terminal 1221 and the negative electrode terminal 1222 are indicated by circles. A central point of the connection with the positive electrode terminal 1221 in the link portion 1225 and a central point of the connection with the negative electrode terminal 1222 are indicated by points. Hereinafter, the central point of the connection with the positive electrode terminal 1221 in the link portion 1225 will be referred to as a first central point CP1. The central point of the connection with the negative electrode terminal 1222 in the link portion 1225 will be referred to as a second central point CP2. The first central point CP1 corresponds to a first connection part. The second central point CP2 corresponds to a second connection part.

In a state where the link portion 1225 is connected with the positive electrode terminal 1221 and the negative electrode terminal 1222, the connection portion 1226 faces apart from, in the height direction, a region between the positive electrode terminal 1221 and the negative electrode terminal 1222 on the upper end surface 1220a of the multiple battery cells 1220. The connection portion 1226 has a reference portion 1227 extending laterally from the link portion 1225. The reference portion 1227 has a length in the longitudinal direction longer than a length of the link portion 1225. The connection portion 1226 includes a compensation portion 1228 extending in the longitudinal direction from the tip (also referred to as a end) of the reference portion 1227. The upper end surface 1220a corresponds to a formation surface.

As shown in FIG. 22, the reference portion 1227 extends in the lateral direction from a midpoint MP between the first central point CP1 and the second central point CP2 of the link portion 1225. A separation distance between an end portion of the reference portion 1227 and the first central point CP1 is equal to a separation distance between the end portion of the reference portion 1227 and the second central point CP2, the end portion being extending from the link portion 1225. Due to the configuration, a resistance value of a first resistor between the first central point CP1 of the link portion 1225 and the end portion of the reference portion 1227 is equal to a resistance value of a second resistor between the second central point CP2 in the link portion 1225 and the end portion of the reference portion 1227.

As described above, each of the series terminal 1223 connected with the electrode terminal configuring the first electrode terminal group 1211 and the series terminal 1223 connected with the electrode terminal configuring the second electrode terminal group 1212 has the reversed connection surface to the battery stack 1210. Therefore, in these two series terminals 1223, each of the first central points CP1 and the second central points CP2 are reversed and replaced. However, in these two series terminals 1223, the separation distance between the end of the reference portion 1227 and the first central point CP1 in the link portion 1225 is equal to the separation distance between the end of the reference portion 1227 and the second central point CP2. Therefore, even when the first central point CP1 and the second central point CP2 are replaced, the resistance values of the first resistor and the second resistor are equal to each other in these two series terminals.

Hereinafter, the resistance value of the first resistor and the second resistor may be defined as R. In order to simplify the description, the resistance value of the reference portion 1227 extending in the lateral direction may be defined as R. The resistance values of the first resistor and the second resistor may be different from the resistance value of the reference portion 1227.

The compensation portion 1228 extends from the tip of the reference portion 1227 along the longitudinal direction in such a mode that the compensation portion 1228 is sustained by one side of the reference portion 1227. Therefore, the connection portion 1226 in the embodiment has a L shape on the upper end surface 1220a. A length in the longitudinal direction of the compensation portion 1228 is about to the output separation distance described above. The compensation portion 1228 is connected with the tip toward the one end of the first wiring 1035 protruding from the first protrusion 1037.

Hereinafter, the resistance value of the compensation portion 1228 may be defined as 2R. In the compensation portion 1228 extending in the longitudinal direction, two resistors of resistance value R are connected in series in the longitudinal direction as shown in FIG. 22. Three end points as a total are positioned at both ends of the two series-connected resistors. The three end points are indicated as a first end point EP1, a second end point EP2, and a third end point EP3 in order of increasing in number as the end point moves away from the tip of the reference portion 1227. One of the two resistors is positioned between the first end point EP1 and the second end point EP2. The remaining one of the two resistors is positioned between the second end point EP2 and the third end point EP3.

As described above, each of the series terminal 1223 connected with the electrode terminal configuring the first electrode terminal group 1211 and the series terminal 1223 connected with the electrode terminal configuring the second electrode terminal group 1212 has the reversed connection surface to the battery stack 1210. An extension direction of the compensation portion 1228 in the series terminal 1223 connected with the electrode terminal configuring the first electrode terminal group 1211 and an extension direction of the compensation portion 1228 in the series terminal 1223 connected with the electrode terminal configuring the second electrode terminal group 1212 are opposite.

Specifically, the compensation portion 1228 in the series terminal 1223 connected with the electrode terminal configuring the first electrode terminal group 1211 extends to the high potential side of the battery stack 1210. Specifically, the compensation portion 1228 in the series terminal 1223 connected with the electrode terminal configuring the second electrode terminal group 1212 extends to the low potential side of the battery stack 1210. In other words, the compensation portion 1228 in the series terminal 1223 connected with the electrode terminal configuring the first electrode terminal group 1211 extends so as to separate from the monitoring portion 1010. The compensation portion 1228 in the series terminal 1223 connected with the electrode terminal configuring the second electrode terminal group 1212 extends so as to approach the monitoring portion 1010.

Accordingly, in the compensation portion 1228 of the series terminal 1223 connected with the electrode terminal configuring the first electrode terminal group 1211, the first end point EP1, the second end point EP2, the third end point EP3 are aligned in order of the direction where the end point is separated from the monitoring portion 1010 in the longitudinal direction. In the compensation portion 1228 of the series terminal 1223 connected with the electrode terminal configuring the second electrode terminal group 1212, the first end point EP1, the second end point EP2, the third end point EP3 are aligned in order of the direction where the end point approaches the monitoring portion 1010 in the longitudinal direction.

(Voltage Drop of Series Terminal)

The voltage drop occurring in the series terminal 1223 will be described.

In the connection configuration described above, the voltage of the battery cell 1220 is input to the comparator 1020 by the series terminal 1223, the first wiring 1035, the substrate wiring 1014, and the wiring of the monitoring IC chip 1013. Each of the series terminal 1223, the first wiring 1035, the substrate wiring 1014 and the wiring of the monitoring IC chip 1013 has a resistance. Accordingly, the voltage drop occurs in an energization path connecting the battery cell 1220 and the comparator 1020.

The one end of the first wiring 1035 is connected with the series terminal 1223. When the connection position of the series terminal 1223 with the first wiring 1035 is equal to connection positions between the multiple series terminals 1223 and the multiple first wirings 1035, the voltage drops occurring due to the current flowing in the resistor of the series terminal 1223 may be comparable. Therefore, the detection accuracy for the voltages of the battery cell 1220 may be difficult to vary, the voltages being detected in the multiple first wirings 1035.

However, when the position connected with the one end of the first wiring 1035 in the series terminal 1223 is changed, the voltage drop occurring due to the flowing current and the resistance of the series terminal 1223 is changed. As the result, the detection accuracy for the voltages of the battery cell 1220 may vary, the voltages being detected in the multiple first wirings 1035. Such a displacement of the connection position occurs due to an unclearness for definition of the connection position or an arrangement deviation of the wiring portion 1030 to the battery stack 1210.

By contrast, the series terminal 1223 in the embodiment includes not only the link portion 1225 but also the connection portion 1226. The one end of the first wiring 1035 is connected with the connection portion 1226 extending from the middle point MP of the link portion 1225. The connection point of the first wiring 1035 is defined by the connection portion 1226. Therefore, each of the voltage drops occurring due to the resistance and current of the connection portion 1226 is equal, the voltage drop being included in the voltage of the battery cell 1220 detected by each of the multiple first wirings 1035. As the result, it may be possible to prevent the occurrence of the variation in the detection accuracy for the voltages of the battery cell 1220, the voltages being detected in the multiple first wirings 1035.

The connection portion 1226 includes the reference portion 1227 extending in the lateral direction from the link portion 1225, and the compensation portion 1228 extending in the longitudinal direction from the tip of the reference portion 1227. The compensation portion 1228 is connected with the one end of the first wiring 1035. Accordingly, it may be possible to connect the first wiring 1035 with the series terminal 1223 even when the one end of the first wiring 1035 is deviated from the series terminal 1223 of a connection target in the longitudinal direction due to the arrangement deviation of the wiring portion 1030 to the battery stack 1210, for example.

The detection current j flowing in the connection portion 1226 connected with the one end of the first wiring 1035 is smaller than the main current l flowing in the link portion 1225. Therefore, an amount of the voltage drop occurring due to the current and the resistor of the connection portion 1226 is small, the voltage drop being included in the detected voltage of the battery cell 1220 in the first wiring 1035. Accordingly, the variation of the detection accuracy for the detected voltage of the battery cell 1220 in the multiple first wirings 1035 is about to The small voltage drop, even when the connection position of the first wiring 1035 and the connection portion 1226 is deviated, for example. Thereby, it may be possible to prevent the occurrence of the variation in the detection accuracy for the voltage of the battery cell 1220, the voltage being detected in each of the multiple first wirings 1035.

Figure 23:
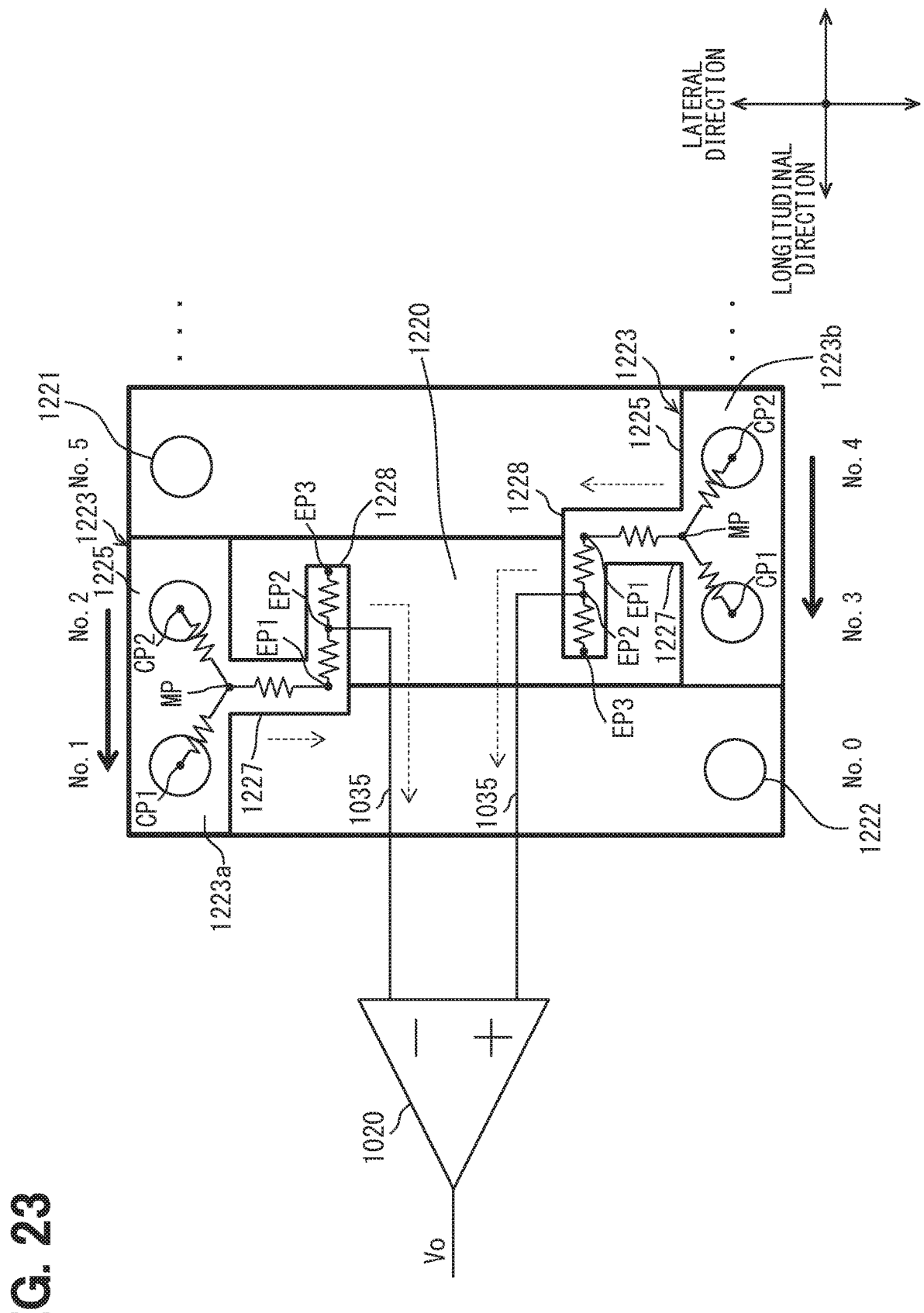
FIG. 23 is a schematic view describing voltage detection of one battery cell.
Figure 24:
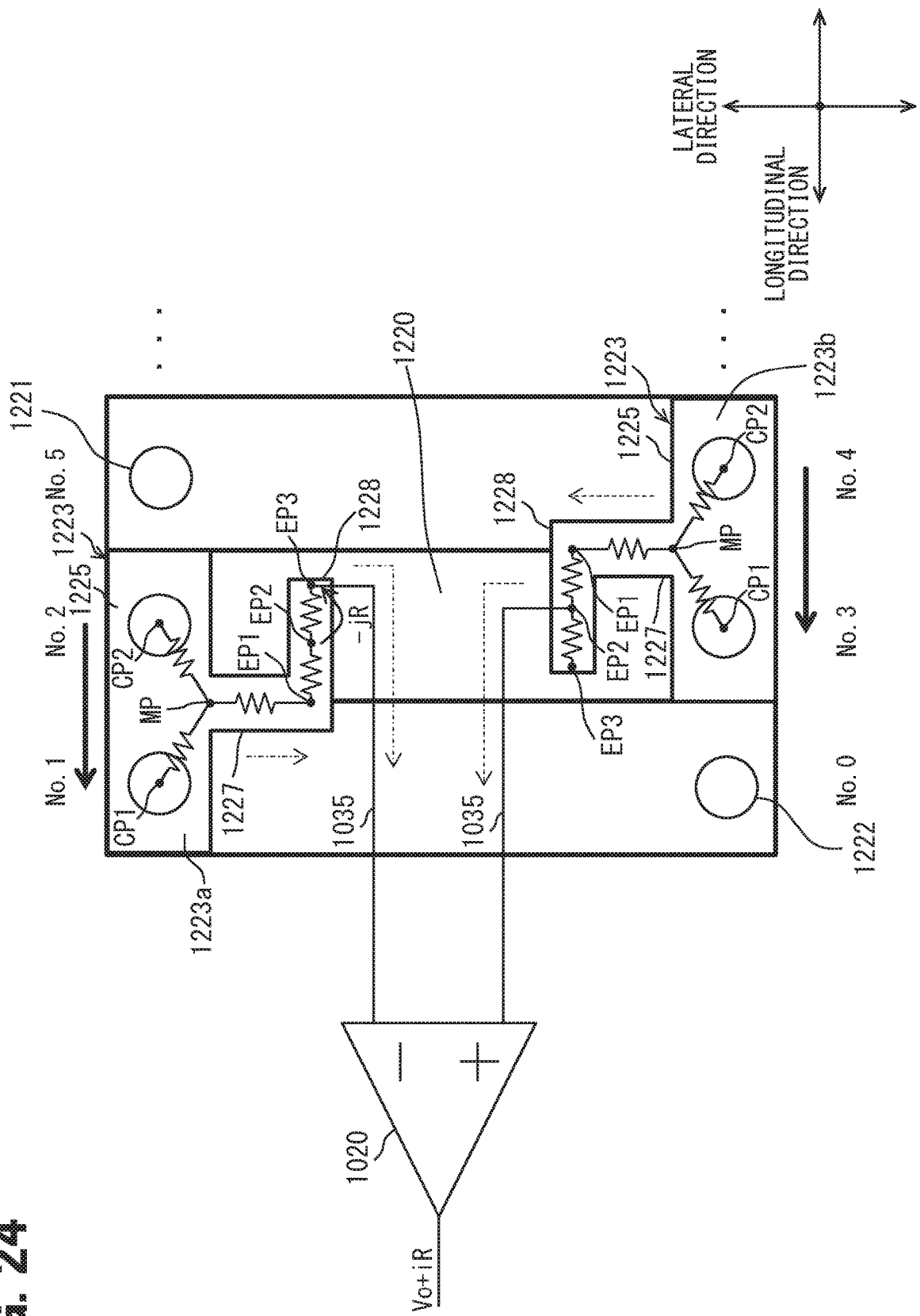
FIG. 24 is a schematic view describing the voltage detection of the battery cell when connection points are different.
Figure 25:
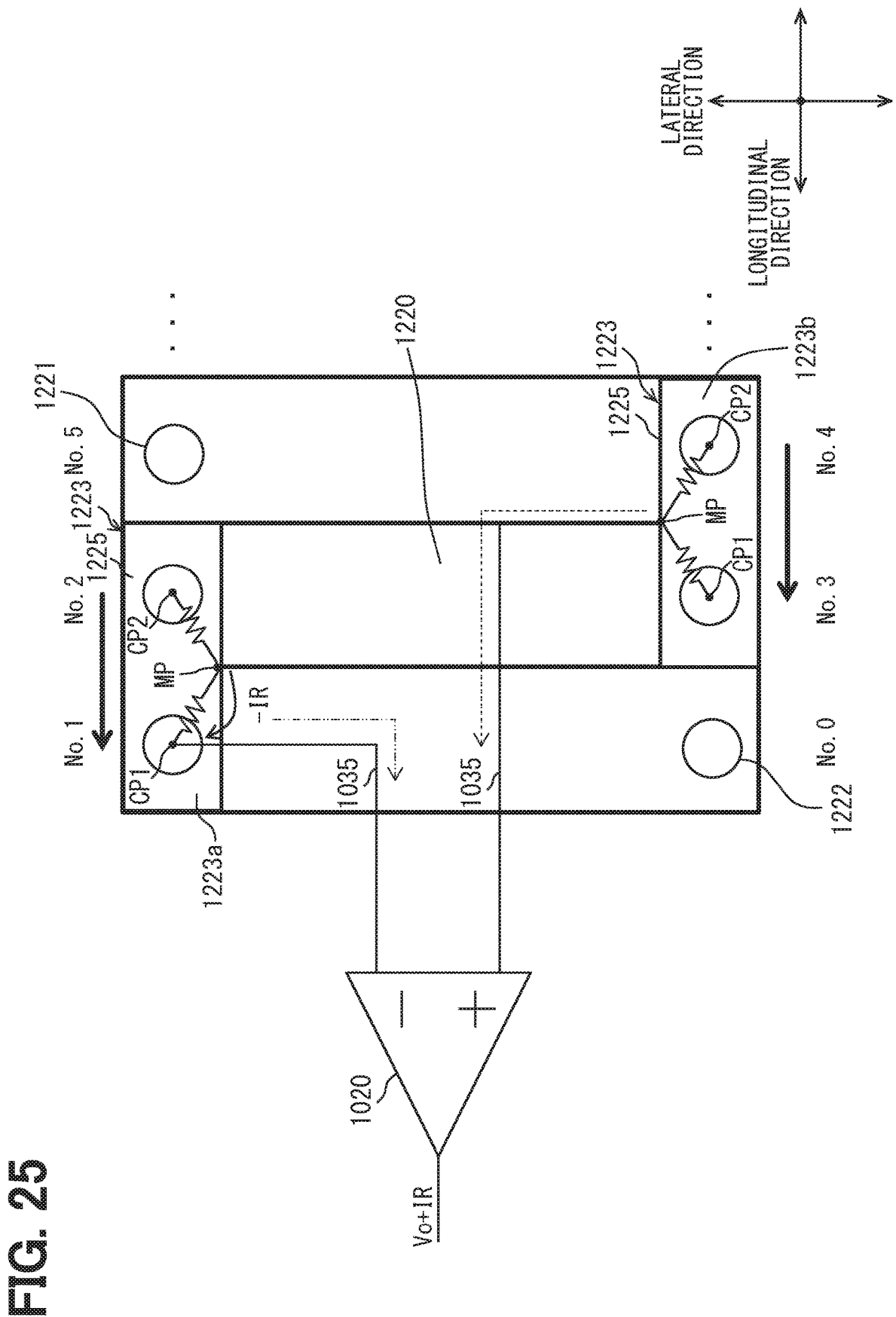
FIG. 25 is a schematic view describing the voltage detection of the battery cell when the connection points are different in a comparative configuration.

Hereinafter, regarding to a case where the arrangement deviation of the wiring portion 1030 to the battery stack 1210 is present and a case where the arrangement deviation of the wiring portion 1030 to the battery stack 1210 is absent, the voltage drop occurring in the series terminal 1223 will be specifically described with reference to FIGS. 23 to 25. FIGS. 23 to 25 show that the series terminal 1223 connects the positive electrode terminal 1221 of No. 1 with the negative electrode terminal 1222 of No. 2. The positive electrode terminal 1221 of No. 1 and the negative electrode terminal 1222 of No. 2 configure the first electrode terminal group 1211. FIGS. 23 to 25 show that the series terminal 1223 connects the positive electrode terminal 1221 of No. 3 with the negative electrode terminal 1222 of No. 4. The positive electrode terminal 1221 of No. 3 and the negative electrode terminal 1222 of No. 4 configure the second electrode terminal group 1212.

Hereinafter, in order to simplify the description, the series terminal 1223 connecting the positive electrode terminal 1221 of No. 1 and the negative electrode terminal 1222 of No. 2 may be referred to as a first series terminal 1223. The series terminal 1223 connecting the positive electrode terminal 1221 of No. 3 and the negative electrode terminal 1222 of No. 4 may be referred to as a second series terminal 1223.

The first series terminal 1223 and the second series terminal 1223 are connected with the positive electrode terminal 1221 and the negative electrode terminal 1222 of the battery cell 1220 having the second lowest potential among the multiple battery cells 1220 aligned in order of potential. The first series terminal 1223 is connected with the negative electrode terminal 1222 of the battery cell 1220. The second series terminal 1223 is connected with the positive electrode terminal 1221 of the battery cell 1220. Accordingly, a potential difference between the first series terminal 1223 and the second series terminal 1223 corresponds to an output voltage of the battery cell 1220. Hereinafter, the battery cell 1220 having the second lowest potential may be merely referred to as a battery cell 1220.

FIG. 23 shows a connection mode of the wiring portion 1030 with the series terminal 1223 in the case where the arrangement deviation of the wiring portion 1030 to the battery stack 1210 is absent. In one example shown in FIG. 23, the second end point EP2 of the first series terminal 1223 is connected with the one end of the first wiring 1035 of the front wiring portion 1031. Similarly, the second end point EP2 of the second series terminal 1223 is connected with the one end of the first wiring 1035 of the back wiring portion 1032. Therefore, the voltage drops included in the voltages detected in these two first wirings 1035 and occurring due to the current and the resistor of the series terminal are equal.

A potential of the negative electrode terminal 1222 of the battery cell 1220 and a potential of the positive electrode terminal 1221 of the battery cell 1220 include the equal voltage drop, and is input to an inversion input terminal and the non-inversion input terminal of the comparator 1020. The comparator 1020 subtracts the potential input to the inversion input terminal and the potential input to the non-inversion input terminal, and outputs an output signal in accordance with a voltage value obtained by the subtraction as the output voltage Vo of the battery cell 1220.

FIG. 24 shows a connection mode of the wiring portion 1030 with the series terminal 1223 in the case where the arrangement deviation of the wiring portion 1030 to the battery stack 1210 is present. In one example shown in FIG. 24, the connection point of the first series terminal 1223 with the one end of the first wiring 1035 of the front wiring portion 1031 is displaced. The third end point EP3 of the first series terminal 1223 is connected with the one end of the first wiring 1035 of the front wiring portion 1031. The second end point EP2 of the second series terminal 1223 is connected with the one end of the first wiring 1035 of the back wiring portion 1032.

The small amount of detection current j flows in the connection portion 1226 as compared to the main current l flowing in the link portion 1225, described above. The resistance value between the second end point EP2 and the third end point EP3 is R. Therefore, the voltage drops included (occurring) in the voltages detected in these two first wirings 1035 and occurring due to the current and the resistor of the series terminal 1223 differ by −jR. Accordingly, when an amplification degree of the comparator 1020 is 1 to simplify the description, the comparator 1020 outputs the Vo+jR as shown in FIG. 24.

The detection current j is small as described above. Therefore, the voltage drop jR is small. Therefore, even when deviation of the connection point occurs, it may be possible to prevent the occurrence of the variation in the detection accuracy for the voltages of the battery cell 1220, the voltages being detected in the multiple first wirings 1035.

FIG. 25 shows, as a comparative configuration, a configuration in which the first series terminal 1223 and the second series terminal 1223 have only the link portion 1225. The middle point MP of the link portion 1225 of the first series terminal 1223 is connected with the one end of the first wiring 1035 of the front wiring portion 1031 even when the arrangement deviation of the wiring portion 1030 to the battery stack 1210 is present. The middle point MP of the link portion 1225 of the second series terminal 1223 is connected with the one end of the first wiring 1035 of the back wiring portion 1032. In the case, the voltage drops of the voltages detected in the two first wirings 1035 are equal.

However, when the arrangement deviation of the wiring portion 1030 to the battery stack 1210 is present, the one end of the first wiring 1035 of the front wiring portion 1031 is connected with the first central point CP1 of the link portion 1225 of the first series terminal 1223, as shown in FIG. 25, for example. The middle point MP of the link portion 1225 of the second series terminal 1223 is connected with the one end of the first wiring 1035 of the back wiring portion 1032.

A large amount of the main current l flows in the link portion 1225 as compared to the detection current j flowing in the connection portion 1226, described above. The resistance value between the first central point CP1 and the middle point MP is R. Therefore, the voltage drops included (occurring) in the voltages detected in these two first wirings 1035 and occurring due to the current and the resistor of the series terminal 1223 differ by −lR. In the case, the comparator 1020 outputs Vo+lR as shown in FIG. 25.

The main current is large as described above. The voltage drop lR is large. Therefore, in the comparative configuration, even when the deviation of the connection point occurs, the variation occurring in the detection accuracy for the voltages of the battery cell 1220 becomes large, the voltages being detected in the multiple first wirings 1035.

In the case of the series terminal 1223 of the embodiment, the voltage drop jR occurring due to the deviation of the connection point is small, as described above. Therefore, it may be possible to prevent the occurrence of the variation in the detection accuracy for the voltages of the battery cell 1220, the voltages being detected in the multiple first wirings 1035.

Figure 26A:
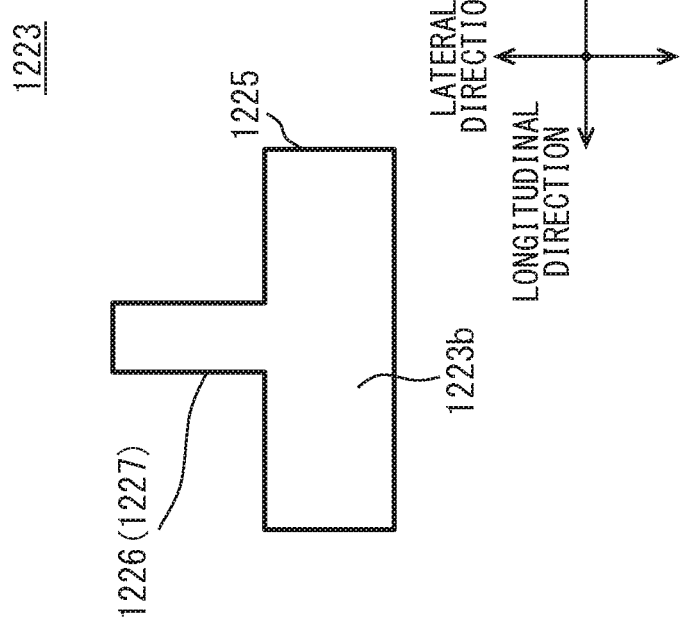
FIG. 26A is a diagram showing a modification of the series terminal.
Figure 26B:
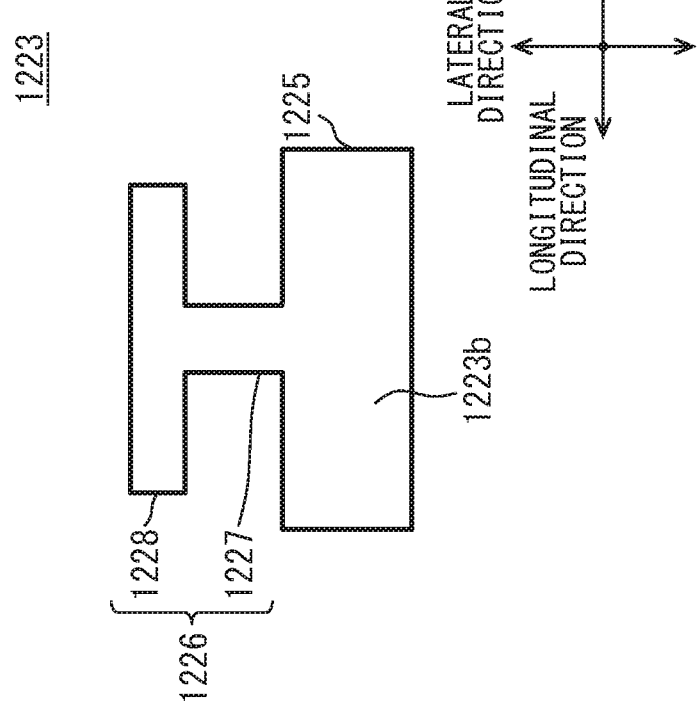
FIG. 26B is a diagram showing a modification of the series terminal.

As shown in FIG. 26A and FIG. 26B, a detailed mode of the series terminal 1223 is not limited to the configuration in the embodiment. For example, the compensation portion 1228 extends in the longitudinal direction from the tip of the reference portion 1227 as shown in FIG. 26A. Thereby, it may be possible to employ a configuration in which the connection portion 1226 has a T shape on the upper end surface 1220a. Thereby, it may be possible to connect the first wiring 1035 with the series terminal 1223 even when the one end of the first wiring 1035 deviates, in the longitudinal direction, from the series terminal 1223 as the connection target to a direction toward the monitoring portion 1010 or an direction away from the monitoring portion 1010.

It may be possible to employ a configuration in which the connection portion 1226 of the series terminal 1223 includes only the reference portion 1227, as shown in FIG. 26B. In the configuration, the tip of the reference portion 1227 is connected with the one end of the first wiring 1035. Thereby, it may be possible to equal the voltage drops included in the voltages of the battery cell 1220, the voltages being detected in each of the multiple first wirings 1035. Even when the connection position of the one end of the first wiring 1035 deviates to the reference portion 1227, the voltage drop occurring due to the deviation is small.

In a case of the configuration shown in FIG. 26B, each length of the first protrusion 1037, the second protrusion 1038, a part toward the one end of the first wiring 1035 and a part toward the one end of the second wiring 1036 is long, and thereby can be bent in the longitudinal direction and the lateral direction. Thereby, the one ends of the first protrusion 1037 and the first wiring 1035 are bend toward the reference portion 1227 of the series terminal 1223 as the connection target even when the arrangement deviation of the wiring portion 1030 to the battery stack 1210 is present, for example. The one ends of the second protrusion 1038 and the second wiring 1036 are bent toward the output terminal 1224 as the connection target. Thereby, it may be possible to connect the tip of the reference portion 1227 of the series terminal 1223 with the one end of the first wiring 1035. It may be possible to connect the tip of the output terminal 1224 with the one end of second wiring 1036.

While the embodiments of the present disclosure have been described above, the present disclosure is not limited to the embodiments described above, and may be carried out with various modifications without departing from the scope of the present disclosure.

(Eighth Modification)

In the embodiment, it is exemplified that the monitoring IC chip 1013 includes the comparator 1020. It is exemplified that the detection current j is smaller than the main current l due to the connection between the input terminal of the comparator 1020 and the series terminal 1223. In the configuration of the embodiment, it is required that the number of the comparators 1020 is same as the number of the battery cells 1220.

By contrast, it may be possible to employ a configuration in which the monitoring IC chip 1013 includes a sample hold circuit and a multiplexer, in addition to the comparator 1020. The sample hold circuit includes switches placed in each of the multiple voltage detection lines aligned in order of potential and capacitors parallelly connected with the voltage detection lines aligned in order of potential in a subsequent stage side to these switches. A capacitance amount of the capacitor is a small. By closing the switch, the detection current j is small and flows in the capacitor. After that, the switch is opened. Thereby, the capacitor stores charge in accordance with the detection current j.

The multiplexer is positioned at the subsequent stage to the capacitor. The multiplexer are connected with the multiple voltage detection lines. The multiplexer selects two of the multiple voltage detection lines and connects the selected voltage detection lines with the comparator 1020. Thereby, the detection current j flows from the capacitor into the comparator 1020. In a case of the modification, the capacitance amount of the capacitor of the sample hold circuit is small. The detection current j is smaller than the main current l. The number of the comparators 1020 can be smaller than the number of the battery cells 1220.

(Ninth Modification)

In the embodiment, a shape of the output terminal 1224 is not particularly described. The shape of the output terminal 1224 can have, for example, a rectangular shape extending in the lateral direction on a place facing in the longitudinal direction as shown in FIG. 18. Similarly, the series terminal 1223 shown in the embodiment, the output terminal 1224 can include the link portion connected with the one electrode terminal and the connection portion extending from the link portion.

(Tenth Modification)

In the embodiment, it is exemplified that the wiring pattern 1034 is placed on the front surface 1033a. However, it may be possible to employ a configuration in which the wiring pattern 1034 is placed on the back surface 1033b.

(Eleventh Modification)

Figure 27:
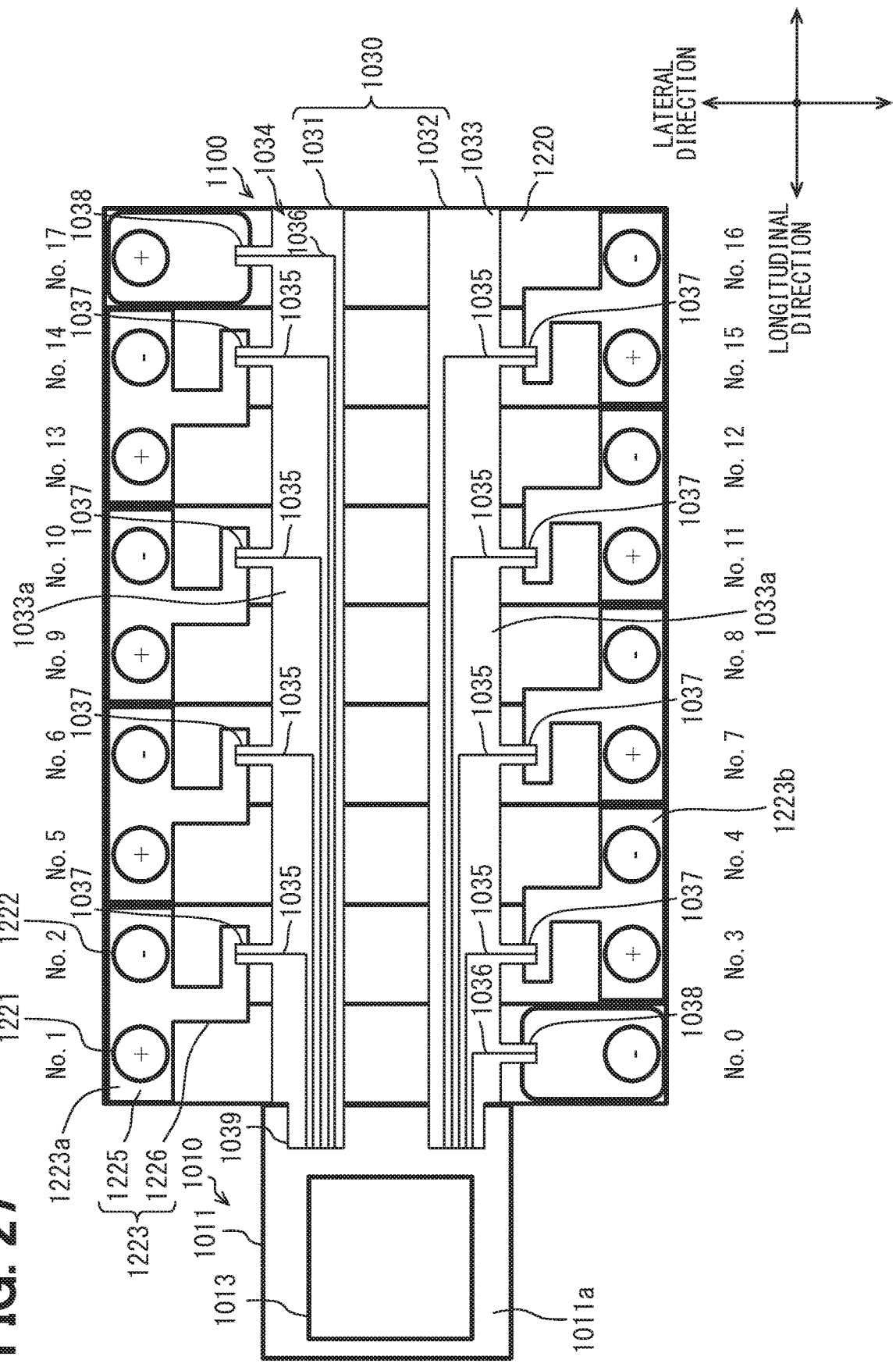
FIG. 27 is a top view describing a modification of the monitoring apparatus.

In the embodiment, it is exemplified that the wiring portion 1030 includes the front wiring portion 1031 and the back wiring portion 1032 having the same configuration. However, the front wiring portion 1031 and the back wiring portion 1032 may not have the same configuration. For example, it may be possible to employ also a configuration in which the front wiring portion 1031 has the first protrusion 1037, the second protrusion 1038, and the wiring pattern 1034 in accordance with the first electrode terminal group 1211, as shown in FIG. 27. It may be possible to employ also a configuration in which the back wiring portion 1032 has the first protrusion 1037, the second protrusion 1038, and the wiring pattern 1034 in accordance with the second electrode terminal group 1212. In FIG. 27, the back wiring portion 1032 is mounted on the battery stack 1210 in such a mode that the back surface 1033b of the flexible substrate 1033 faces the upper end surface 1220a of the battery cell 1220. It may be possible to employ also a configuration (not shown) in which the front wiring portion 1031 and the back wiring portion 1032 are integrally connected.

(Twelfth Modification)

In the embodiment, it is exemplified that the battery stack 1210 has nine battery cells 1220. However, the number of the battery cells 1220 of the battery stack 1210 is not limited to the example described above, and may be plural. The battery stack 1210 may have an even number of battery cells 1220.

In the embodiments, it is exemplified that the battery module 1200 has one battery stack 1210. However, the battery module 1200 may have multiple battery stacks 1210. In the case, the housing of the battery module 1200 includes the accommodation spaces in accordance with each of the battery stacks 1210. These multiple accommodation spaces are aligned in the lateral direction.

For example, when the battery cells 1220 of two battery stacks 1210 are connected in series, each of the two battery stacks 1210 has a same even number of battery cells 1220. The multiple battery cells 1220 of each of the two battery stacks 1210 are aligned in the longitudinal direction. The wire electrically connects the negative electrode terminal 1222 of the battery cell 1220 positioned at a right end in the longitudinal direction in one of the two battery stacks 1210, with the positive electrode terminal 1221 of the battery cell 1220 positioned at a right end of the other of the two battery stacks 1210. Thereby, the negative electrode terminal 1222 of the battery cell 1220 positioned at a left end in the longitudinal direction in one of the two battery stacks 1210 has the lowest potential. The positive electrode terminal 1221 of the battery cell 1220 positioned at a left end of the other of the two battery stacks 1210 has the highest potential. The positive electrode terminal 1221 having the highest potential and the negative electrode terminal 1222 having the lowest potential are arranged to be aligned in the lateral direction. The wiring portion 1030 is placed on each of the two battery stacks 1210.

(Other Modifications)

In the embodiment, it is exemplified that the battery pack 1400 is applied to the hybrid vehicle. However, the battery pack 1400 can also be applied to, for example, a plug-in hybrid vehicle and an electric vehicle.

In the present disclosure, a monitoring apparatus includes: multiple series terminals that connects a positive electrode terminal of a first cell and a negative electrode terminal of a second cell, the first cell and the second cell being included in at least three battery cells that are aligned in a first direction and being placed adjacent to each other; a wiring portion that includes a wiring pattern connected with the series terminals; and a monitoring portion that monitors a voltage of each of the battery cells input through the wiring pattern. Each of the series terminals includes a link portion extending in the first direction to be connected with the positive electrode terminal and the negative electrode terminal, and a connection portion that extending from a middle point between a first connection point where the positive electrode terminal is connected with the link portion and a second connection portion where the negative electrode terminal is connected with the link portion. The wiring pattern of the wiring portion is connected with the connection portion.

The connection portion extending from the middle point of the link portion is connected with the wiring pattern. Therefore, the voltage drops of the voltages detected in each of the multiple wiring patterns may be equal to each other, the voltage drops occurring due to the current and the resistor of the series terminal. As the result, it may be possible to prevent the occurrence of the variation in the detection accuracy for the voltages.

What is claimed is:

1. A monitoring apparatus comprising:
    a monitoring portion configured to monitor a voltage of each of a plurality of battery cells connected in series, each of the battery cells having an electrode terminal; and
    a wiring portion that electrically connects the monitoring portion and the electrode terminals of the battery cells, wherein:
    the wiring portion includes a flexible substrate that includes a first flexible substrate and a second flexible substrate that have flexibility and are integrally linked with each other;
    a wiring pattern is provided on the substrate;
    a linking part where the first flexible substrate and the second flexible substrate are linked is bent;
    the first flexible substrate is connected with the electrode terminals;
    the second flexible substrate is connected with the monitoring portion;
    one of the first flexible substrate and the second flexible substrate includes an arm having an insertion portion, the arm including a reinforcement material that is (i) more rigid than a formation material of the substrate and (ii) made of a same material as the wiring pattern provided on the substrate;
    another of the first flexible substrate and the second flexible substrate other than the one including the arm includes a slit; and
    the insertion portion is inserted into the slit and the arm is fixed to the other of the first and second flexible substrates that includes the slit, causing the linking part to be reinforced.

2. The monitoring apparatus according to claim 1, wherein:
    the second flexible substrate includes the arm; and
    the first flexible substrate includes the slit.

3. The monitoring apparatus according to claim 1, wherein:
    the battery cells are aligned in a first direction;
    each of the battery cells includes a formation surface;
    the electrode terminal of each of the battery cells includes a positive electrode terminal and a negative electrode terminal, the positive electrode terminal and the negative electrode terminal being aligned in a second direction crossing the first direction;
    the positive electrode terminal of a first cell of the battery cells and the negative electrode terminal of a second cell of the battery cells are alternately aligned in the first direction, which configures
        a first electrode terminal group in which the positive electrode terminal and the negative electrode terminal are alternately aligned, and
        a second electrode terminal group in which the positive electrode terminal and the negative electrode terminal are alternately aligned in a reversed order of the first electrode terminal group;
    the electrode terminal of each of the battery cells is provided on the formation surface;
    the first flexible substrate faces the formation surfaces;
    the first flexible substrate is placed between the first electrode terminal group and the second electrode terminal group; and
    the monitoring portion and the second flexible substrate are placed on a side surface of a battery cell which is positioned at an end of the battery cells aligned in the first direction.

4. The monitoring apparatus according to claim 1, wherein:
    the battery cells are aligned in a first direction;
    each of the battery cells includes a formation surface;
    the electrode terminal of each of the battery cells includes a positive electrode terminal and a negative electrode terminal, the positive electrode terminal and the negative electrode terminal being aligned in a second direction crossing the first direction;
    the positive electrode terminal of a first cell of the battery cells and the negative electrode terminal of a second cell of the battery cells are alternately aligned in the first direction, which configures a first electrode terminal group in which the positive electrode terminal and the negative electrode terminal are alternately aligned, and a second electrode terminal group in which the positive electrode terminal and the negative electrode terminal are alternately aligned in a reversed order of the first electrode terminal group;

the second flexible substrate is bent;

the electrode terminal of each of the battery cells is provided on the formation surface; and the first flexible substrate, the second flexible substrate, and the monitoring portion are placed between the first electrode terminal group and the second electrode terminal group, and are overlapped with each other on the formation surfaces.

5. The monitoring apparatus according to claim 1, wherein:

the monitoring portion includes a wiring substrate connected with the second substrate; and the monitoring portion further includes a monitoring IC chip placed on the wiring substrate.

* * * * *